(12) United States Patent
Nakamura et al.

(10) Patent No.: US 11,953,308 B2
(45) Date of Patent: Apr. 9, 2024

(54) LIGHT EMITTING ELEMENT ARRAY AND OPTICAL MEASURING SYSTEM

(71) Applicant: FUJIFILM BUSINESS INNOVATION CORP., Tokyo (JP)

(72) Inventors: Shigetoshi Nakamura, Ebina (JP); Kenichi Ohno, Ebina (JP); Michiaki Murata, Ebina (JP); Tsutomu Ishii, Ebina (JP); Jiro Minabe, Ebina (JP)

(73) Assignee: FUJIFILM Business Innovation Corp., Tokyo (JP)

(*) Notice: Subject to any disclaimer, the term of this patent is extended or adjusted under 35 U.S.C. 154(b) by 926 days.

(21) Appl. No.: 16/939,168

(22) Filed: Jul. 27, 2020

(65) Prior Publication Data

US 2020/0355493 A1 Nov. 12, 2020

Related U.S. Application Data

(63) Continuation of application No. PCT/JP2019/012869, filed on Mar. 26, 2019.

(30) Foreign Application Priority Data

Jun. 28, 2018 (JP) ................................ 2018-123616

(51) Int. Cl.
*G01C 3/08* (2006.01)
*G01B 11/02* (2006.01)
(Continued)

(52) U.S. Cl.
CPC ............ *G01B 11/026* (2013.01); *G01B 11/24* (2013.01); *G01C 3/08* (2013.01); *G02B 3/0006* (2013.01);
(Continued)

(58) Field of Classification Search
CPC .. G01B 11/026; G01B 11/24; G01B 19/0066; G01C 3/08; G02B 3/0006; G02B 3/0043;
(Continued)

(56) References Cited

U.S. PATENT DOCUMENTS

2010/0303113 A1 12/2010 Joseph
2011/0148328 A1 6/2011 Joseph et al.
(Continued)

FOREIGN PATENT DOCUMENTS

CN 102736384 A 10/2012
CN 102866500 A 1/2013
(Continued)

OTHER PUBLICATIONS

Jul. 12, 2022 Office Action issued in Japanese Patent Application No. 2018-123616.
(Continued)

*Primary Examiner* — Daniel L Murphy
(74) *Attorney, Agent, or Firm* — Oliff PLC

(57) ABSTRACT

A light emitting element array includes: a light emitting element group that includes plural light emitting elements; and plural lenses that are provided, corresponding to the plural light emitting elements, on a light emitting surface side of the plural light emitting elements, and that deflects light emitted from the plural light emitting elements according to a positional relation with the plural light emitting elements. Distances between central axes of light emission of the plural light emitting elements and central axes of the plural lenses corresponding to the plural light emitting elements increase from a center side of the light emitting element group toward an end side of the light emitting element group, and a degree of change in the distances
(Continued)

decreases from the center side of the light emitting element group toward the end side of the light emitting element group.

16 Claims, 10 Drawing Sheets

(51) Int. Cl.
    *G01B 11/24*     (2006.01)
    *G02B 3/00*     (2006.01)
    *G06V 10/145*     (2022.01)
    *H01S 5/323*     (2006.01)
    *H01S 5/42*     (2006.01)

(52) U.S. Cl.
    CPC ........ *G06V 10/145* (2022.01); *H01S 5/32316* (2013.01); *H01S 5/423* (2013.01)

(58) Field of Classification Search
    CPC .............. G02B 3/0056; G02B 19/0057; G06V 10/145; H01S 5/32316; H01S 5/423; H01S 5/18311; H01S 5/19388; H01S 5/18394; G06T 1/00; H01L 33/02; H01L 33/58
    USPC ....................................................... 356/4.01
    See application file for complete search history.

(56) References Cited

U.S. PATENT DOCUMENTS

| | | |
|---|---|---|
| 2011/0176567 A1 | 7/2011 | Joseph |
| 2012/0093188 A1 | 4/2012 | Ikuta |
| 2012/0199852 A1 | 8/2012 | Lowes et al. |
| 2012/0249972 A1 | 10/2012 | Kurosaki |
| 2013/0010215 A1 | 1/2013 | Taketsu et al. |
| 2013/0206967 A1 | 8/2013 | Shpunt et al. |
| 2013/0207970 A1 | 8/2013 | Shpunt et al. |
| 2013/0223846 A1 | 8/2013 | Joseph et al. |
| 2013/0250387 A1 | 9/2013 | Chayat et al. |
| 2013/0266326 A1 | 10/2013 | Joseph et al. |
| 2013/0278151 A1 | 10/2013 | Lear |
| 2014/0079088 A1 | 3/2014 | Joseph |
| 2014/0153001 A1 | 6/2014 | Chayat et al. |
| 2014/0291491 A1 | 10/2014 | Shpunt et al. |
| 2014/0291496 A1 | 10/2014 | Shpunt et al. |
| 2015/0063387 A1 | 3/2015 | Joseph et al. |
| 2015/0260847 A1 | 9/2015 | Sromin et al. |
| 2015/0340841 A1 | 11/2015 | Joseph |
| 2015/0377696 A1 | 12/2015 | Shpunt et al. |
| 2016/0018081 A1 | 1/2016 | Kadoriku et al. |
| 2016/0080077 A1 | 3/2016 | Joseph et al. |
| 2016/0146939 A1 | 5/2016 | Shpunt et al. |
| 2016/0164261 A1 | 6/2016 | Warren |
| 2016/0178895 A1 | 6/2016 | Gerson et al. |
| 2016/0186958 A1 | 6/2016 | Nagahara et al. |
| 2017/0097407 A1 | 4/2017 | Shpunt et al. |
| 2017/0205873 A1 | 7/2017 | Shpunt et al. |
| 2017/0276931 A1 | 9/2017 | Gerson et al. |
| 2018/0120931 A1 | 5/2018 | Shpunt et al. |
| 2018/0292537 A1 | 10/2018 | Sromin et al. |
| 2019/0196579 A1 | 6/2019 | Shpunt et al. |
| 2019/0268068 A1 | 8/2019 | Dacha et al. |

FOREIGN PATENT DOCUMENTS

| | | |
|---|---|---|
| JP | 2006-066538 A | 3/2006 |
| JP | 2009-135312 A | 6/2009 |
| JP | 2012-109543 A | 6/2012 |
| JP | 2014-027010 A | 2/2014 |
| JP | 2016-519436 A | 6/2016 |
| JP | 2016-127022 A | 7/2016 |
| JP | 2016-146417 A | 8/2016 |
| JP | 2016-224058 A | 12/2016 |
| JP | 2019-071370 A | 5/2019 |
| WO | 2012/096203 A1 | 7/2012 |
| WO | 2014/175901 A1 | 10/2014 |
| WO | 2015/064073 A1 | 5/2015 |

OTHER PUBLICATIONS

Feb. 15, 2022 Notice of Reasons for Refusal issued in Japanese Patent Application No. 2018-123616.
Jan. 18, 2023 Office Action and Search Report issued in Chinese Patent Application No. 201980018986.6.
Aug. 9, 2023 Office Action issued in Chinese Patent Application No. 201980018986.6.
Jun. 11, 2019 International Search Report issued in Internaitonal Patent Application No. PCT/JP2019/012869.
Jun. 11, 2019 Written Opinion issued in International Patent Application No. PCT/JP2019/012869.

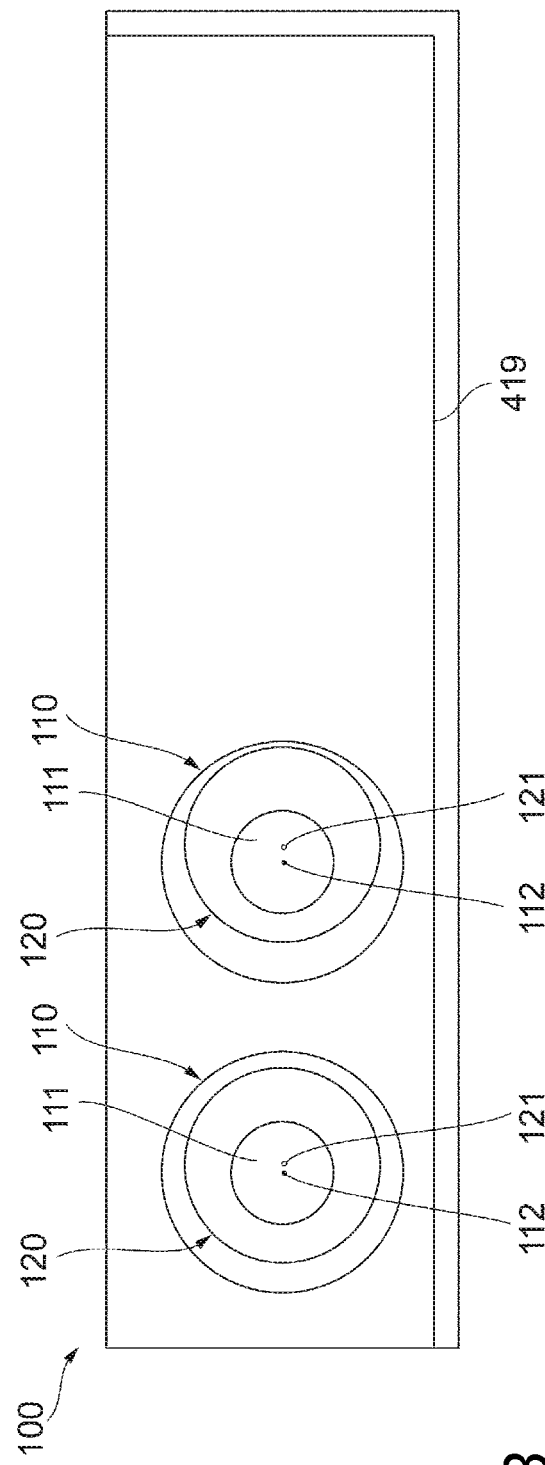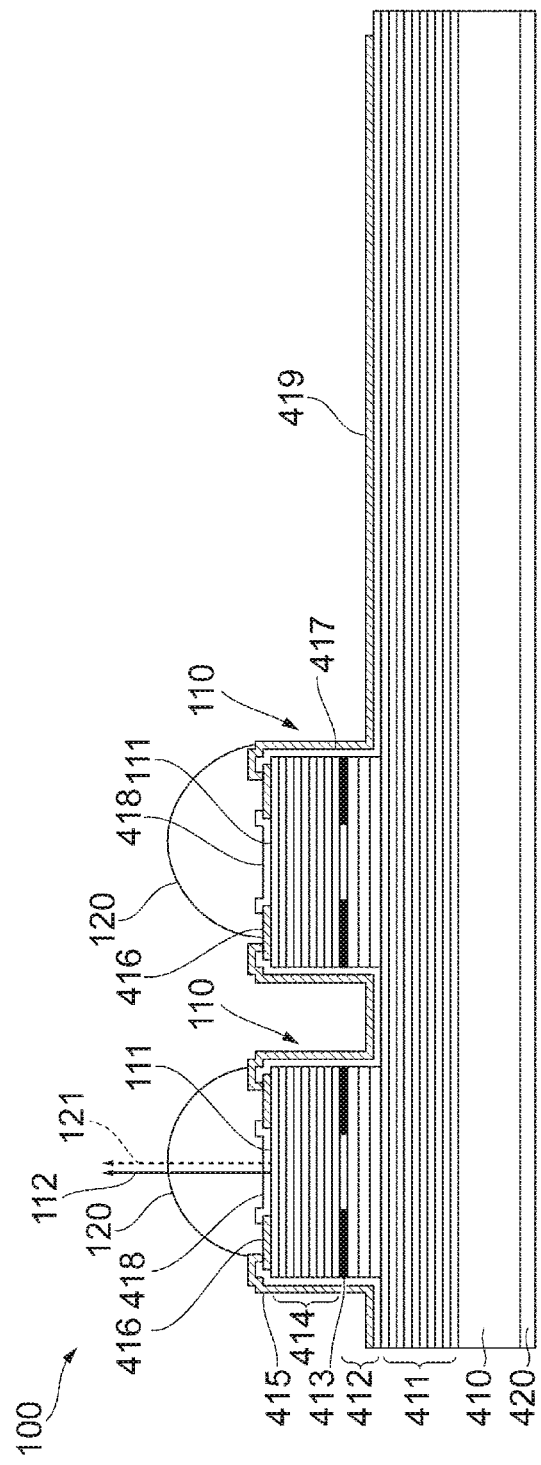

FIG. 7A
FIRST COMPARATIVE EXAMPLE
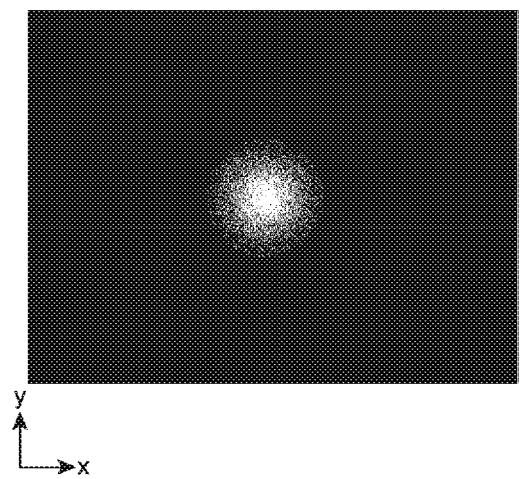
FIG. 7B
SECOND COMPARATIVE EXAMPLE
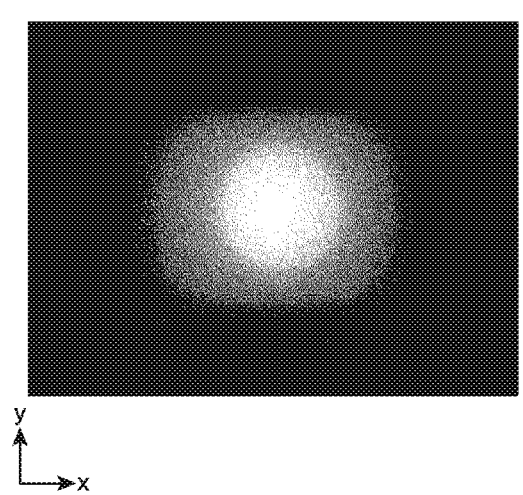
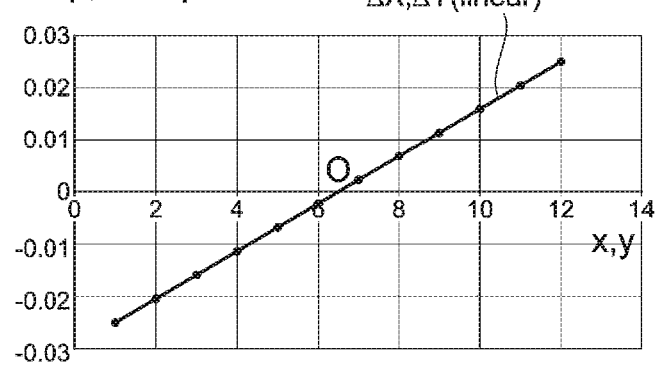

FIG. 8A
FIRST EXAMPLE
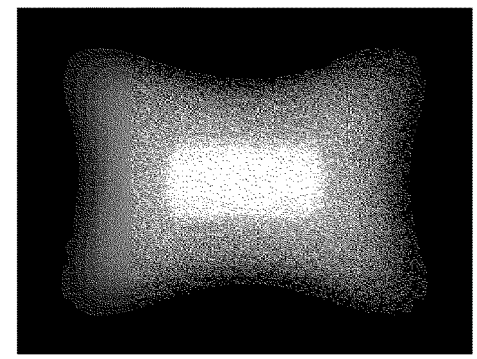
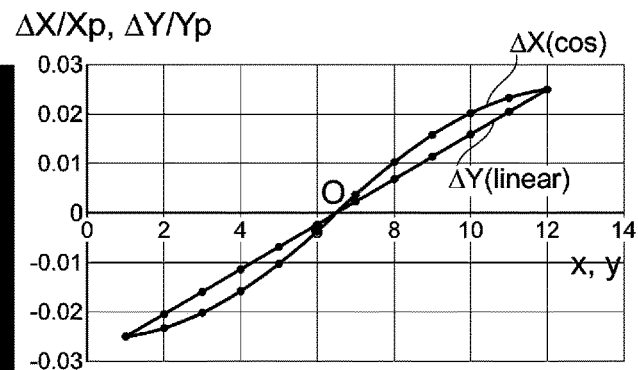
FIG. 8B
SECOND EXAMPLE
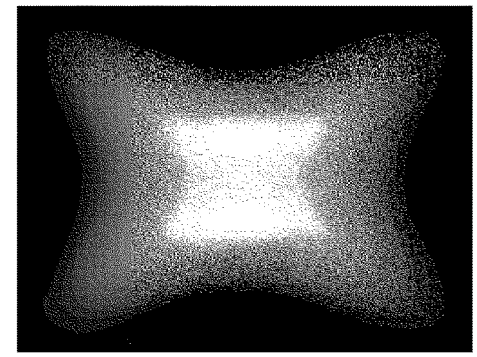
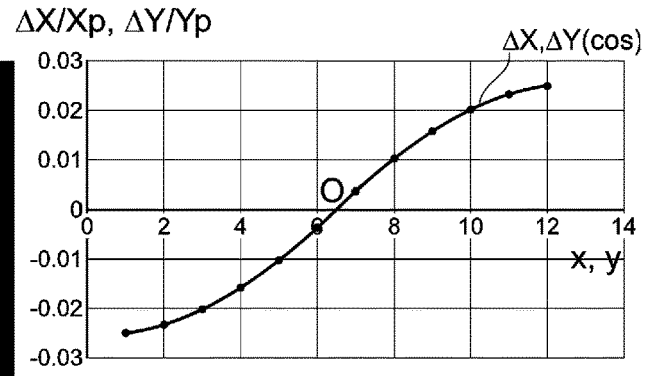
FIG. 8C
THIRD EXAMPLE
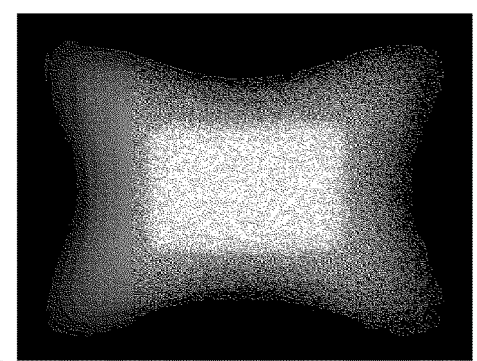
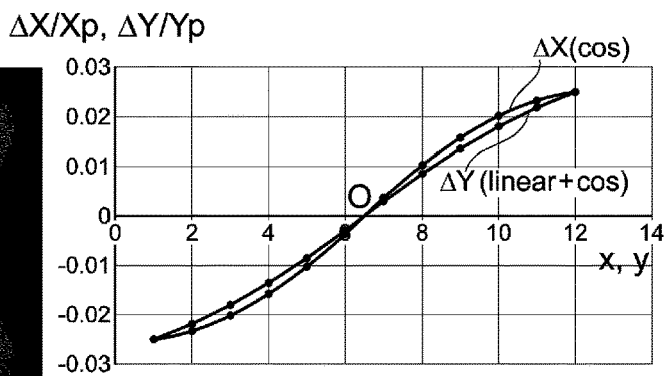

LIGHT EMITTING ELEMENT ARRAY AND OPTICAL MEASURING SYSTEM

CROSS-REFERENCE TO RELATED APPLICATIONS

This is a continuation of International Application No. PCT/JP2019/012869 filed on Mar. 26, 2019, and claims priority from Japanese Patent Application No. 2018-123616 filed on Jun. 28, 2018.

BACKGROUND

Technical Field

The present invention relates to a light emitting element array and an optical measuring system.

Related Art

JP-A-2016-224058 discloses an opto-electronic module which includes a micro-optical substrate, a beam transmitter mounted on the micro-optical substrate and configured to emit at least one laser beam along a beam axis, and a receiver mounted on the micro-optical substrate and configured to sense light which is received along a collection axis of the receiver by the module, and wherein the beam transmitter includes an array of surface-emitting element devices and beams emitted by the surface-emitting element devices are collected by an array of corresponding micro lenses, and the beams are directed to a collimation lens.

SUMMARY

In some cases of determining the distance to an object, the shape of an object, or the like using light emitted from a light emitting element group composed of a plurality of light emitting elements, it is required to satisfy predetermined light amount uniformity on an irradiation surface which is irradiated with emitted light. In such a case, a method using a configuration in which lenses are provided for every light emitting element in order to increase the distances between the central axes of light emission of the light emitting elements and the central axes of the lenses corresponding to the light emitting elements to a certain degree as it goes from the center side of the light emitting element group to the end side may be considered. However, when the distances are increased to a certain degree, as it goes to the edge side of the light emitting element group, the amount of light per unit area (illuminance) on the irradiation surface may decrease, whereby the predetermined light amount uniformity on the irradiation surface may not be satisfied.

Aspects of non-limiting embodiments of the present disclosure relate to providing a light emitting element array and an optical measuring system in which the amount of light on an irradiation surface is uniform as compared to the configuration in which the distances between the central axes of light emission of the light emitting elements and the central axes of the lenses corresponding to the light emitting elements increase to a certain degree from the center side of the light emitting element group toward the end side.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light emitting element array including: a light emitting element group that includes plural light emitting elements; and plural lenses that are provided, corresponding to the plural light emitting elements, on a light emitting surface side of the plural light emitting elements, and that deflects light emitted from the plural light emitting elements according to a positional relation with the plural light emitting elements, wherein distances between central axes of light emission of the plural light emitting elements and central axes of the plural lenses corresponding to the plural light emitting elements increase from a center side of the light emitting element group toward an end side of the light emitting element group, and a degree of change in the distances decreases from the center side of the light emitting element group toward the end side of the light emitting element group.

BRIEF DESCRIPTION OF DRAWINGS

Exemplary embodiment(s) of the present invention will be described in detail based on the following figures, wherein:

FIGS. 3A and 3B are enlarged views of a part of a light emitting element array, in which FIG. 3A is a top view of the part of the light emitting element array, and FIG. 3B is a cross-sectional view of the part of the light emitting element array;

FIGS. 4A to 4F are views for explaining a manufacturing method in the case where light emitting elements are vertical cavity surface-emitting lasers, in which FIG. 4A illustrates a semiconductor-layer laminate forming process, FIG. 4B illustrates a mesa etching process, FIG. 4C illustrates an oxidized-region forming process, FIG. 4D illustrates a p-side electrode forming process and an interlayer insulating layer forming process, FIG. 4E illustrates a light-emitting-surface protecting layer forming process and an n-side electrode forming process, and FIG. 4F illustrates a wiring-layer forming process and a lens forming process;

FIGS. 5A and 5B are views for explaining the amount of light on an irradiation surface which is irradiated with light by the light emitting element array, in which FIG. 5A is a view for explaining a state where light is radiated toward the irradiation surface by the light emitting element array, and FIG. 5B is a view for explaining the amount of light on the irradiation surface;

FIGS. 7A and 7B are views for explaining comparative examples related to the effect of the distances between the central axes of the lenses and the central axes of light emission of the light emitting elements in the light emitting element array, in which FIG. 7A illustrates a first comparative example without lenses, and FIG. 7B illustrates a second comparative example in which the distances in an x direction between the central axes of the lenses and the central axes of light emission and distances in a y direction between them are changed linearly as it goes from the center (O) side toward the end side;

FIGS. 8A to 8C are views for explaining examples related to the effect of the distances between the central axes of the lenses and the central axes of light emission of the light emitting elements, in which FIG. 8A is a view for explaining a first example in which the distances in the x direction between the central axes of the lenses and the central axes of light emission are changed by a cosine function as it goes from the center side toward the end side, and the distances in the y direction are changed linearly as it goes from the center side toward the end side, FIG. 8B is a view for explaining a second example in which the distances in the x direction between the central axes of the lenses and the central axes of light emission and the distances in the y direction between them are changed by a cosine function as it goes from the center side toward the end side, and FIG. 8C is a view for explaining a third example in which the distances in the x direction between the central axes of the lenses and the central axes of light emission are changed by a cosine function as it goes from the center side toward the end side, and the distances in the y direction are changed by the averages of the values of a cosine function and a linear function as it goes from the center side toward the end side;

FIGS. 9A and 9B are views for explaining an example of a method of deflecting light which the light emitting elements emit by the lenses according to a second exemplary embodiment, in which FIG. 9A is a view for explaining the relation between the lenses and the light emitting elements in the light emitting element array, and FIG. 9B is a view for explaining light traveling from the light emitting device to the irradiation surface; and FIGS. 10A and 10B are views for explaining an example of a method of deflecting light which the light emitting elements emit by the lenses according to a third exemplary embodiment, in which FIG. 10A is a view for explaining the relation between the lenses and the light emitting elements in the light emitting element array, and FIG. 10B is a view for explaining light traveling from the light emitting device to the irradiation surface.

DETAILED DESCRIPTION

Hereinafter, exemplary embodiments of the present invention will be described in detail with reference to the accompanying drawings.

Moreover, hereinafter, atomic symbols will be used for denotation such as referring to aluminum as Al.

First Exemplary Embodiment (Optical Measuring System 1)

Figure 1:
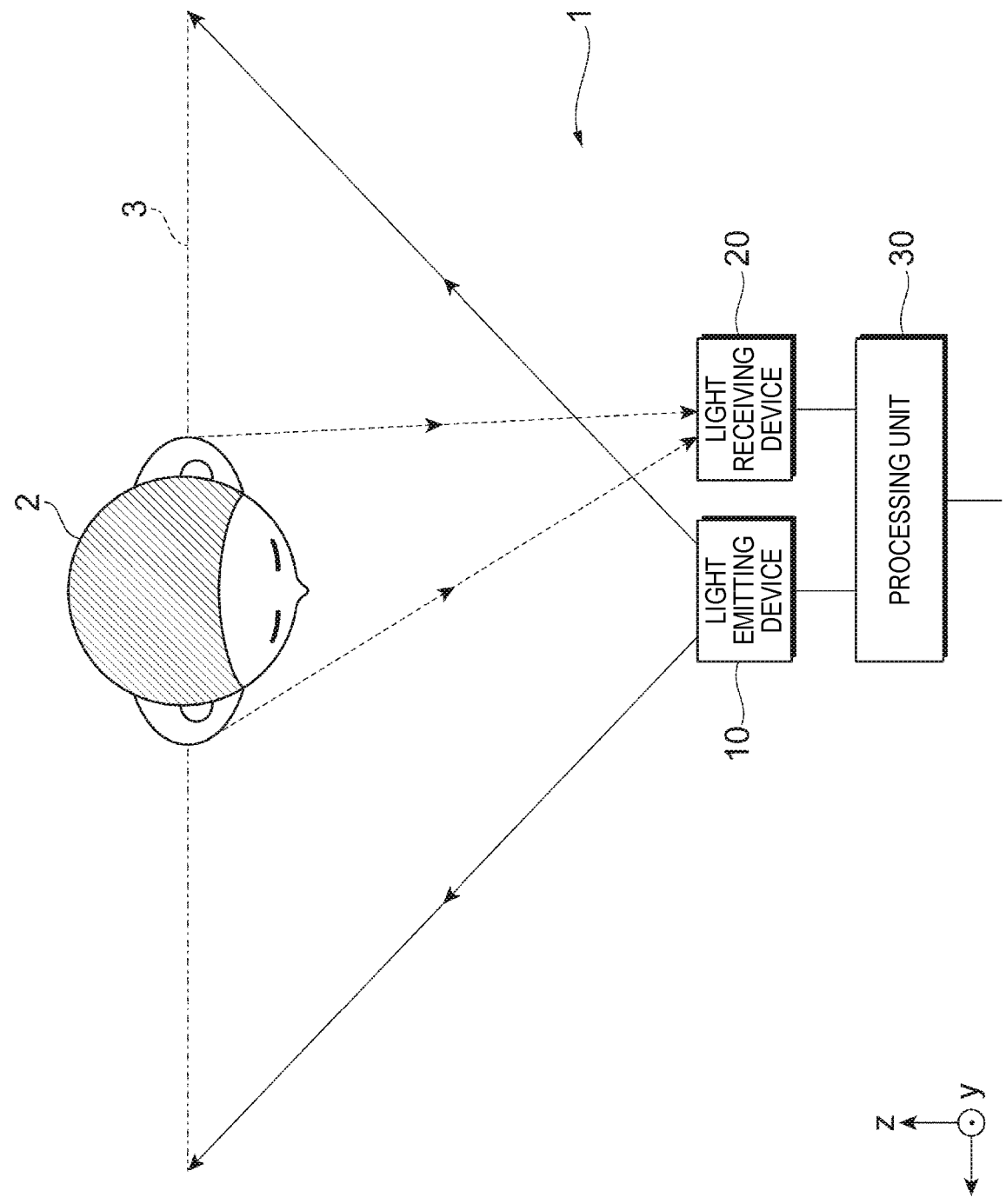
FIG. 1 is a view illustrating an optical measuring system according to a first exemplary embodiment.

FIG. 1 is a view illustrating an optical measuring system 1 according to the first exemplary embodiment. In FIG. 1, the direction from the right to the left is referred to as an x direction, and the direction perpendicular to the plane of the sheet is referred to as a y direction, and the direction from the bottom to the top is referred to as a z direction. FIG. 1 illustrates the zx plane.

The optical measuring system 1 includes a light emitting device 10, a light receiving device 20, and a processing unit 30. A measurement object 2 is disposed to face the optical measuring system 1. Here, the measurement object 2 is a person. Here, the person stands upright in the y direction from the zx plane.

The light emitting device 10 is a device for emitting light toward the measurement object 2. The light emitting device 10 emits light in the positive z direction defined when it assumed that the light emitting device 10 is the center, from the light emitting device 10, as shown by solid lines. Moreover, the light travels in the positive z direction while spreading in the positive and negative x directions and the positive and negative y directions. In other words, the light emitting device 10 emits light toward an irradiation surface 3 which is a virtual two-dimensional plane provided at the position of the measurement object 2. Here, a cross section of the irradiation surface 3 on the zx plane is shown by an alternate long and short dash line.

The light emitting device 10 includes a plurality of light emitting elements (light emitting elements 110 to be described below). As examples of the plurality of light emitting elements, vertical cavity surface-emitting lasers VCSEL will be described. The vertical cavity surface-emitting lasers VCSEL are disposed at predetermined intervals, and constitute a light emitting element array (a light emitting element array 100 to be described below). Hereinafter, the light emitting element array 100 may be used synonymously with the light emitting device 10.

The light receiving device 20 is a device for receiving light and outputting an electric signal corresponding to the amount of light. In FIG. 1, the light receiving device 20 receives light traveling from the negative z direction toward the light receiving device 20, as shown by broken lines. At this time, the light receiving device also receives light traveling from the positive and negative x directions and the positive and negative y directions toward the light receiving device 20.

An example of the light receiving device 20 is an imaging device having light receiving elements capable of imaging received light as an image and arranged in a matrix. In the imaging device, the light receiving elements may be called light receiving cells. The imaging device outputs the amounts of light having entered the individual light receiving cells for a predetermined period as electric signals. In other words, a two-dimensional image representing the amounts of light having entered the individual light receiving cells is acquired by the imaging device. Also, a two-dimensional image which is acquired in a predetermined period is referred to as a frame image. As the imaging device, for example, imaging devices configured with CMOSs and CCDs may be used.

Light emitted from the light emitting device 10 is reflected by the measurement object 2, and is received by the light receiving device 20. In FIG. 1, the light receiving device 20 is provided on the side where the light emitting device 10 is disposed. Here, both of the light emitting surface of the light emitting device 10 for emitting light and the light receiving surface of the light receiving device 20 for receiving light are disposed so as to face the measurement object 2. However, the light receiving device 20 needs only to be disposed at a position where reflected light of light emitted from the light emitting device 10 is easily received. The light receiving device 20 may be provided adjacent to the light emitting device 10 so as to easily receive light emitted from the light emitting device 10. It is preferable that the positions of the light emitting device 10 and the light receiving device 20 and the interval between them should be predetermined.

Also, the light receiving device 20 may be a photodiode (PD) instead of an imaging device.

The processing unit 30 is, for example, a processing means configured as a computer having an input/output unit for inputting and outputting data. In other words, the processing unit 30 includes a CPU (Central Processing Unit), a ROM (Read Only Memory), a RAM (Random Access Memory), and so on in addition to the input/output unit.

Further, the processing unit 30 is connected to the light emitting device 10 and the light receiving device 20, and controls the light emitting device 10 and the light receiving device 20 by installed application software. Also, the processing unit 30 may be configured with an application-specific integrated circuit (ASIC). In this way, the processing unit 30 is configured with, for example, one or more semiconductor components (IC).

The outline of the operation of the optical measuring system 1 will be described.

In the optical measuring system 1, light emitted from the light emitting device 10 is falls on the measurement object 2. Then, the reflected light from the measurement object 2 is received by the light receiving device 20. The processing unit 30 receives and processes information on the reflected light received by the light receiving device 20, thereby calculating information on the measurement object 2, such as the distance to the measurement object 2, the three-dimensional shape of the measurement object 2, etc.

For example, the processing unit 30 controls the light emitting device 10 such that light is emitted from the light emitting element array 100 of the light emitting device 10 for a short period. In other words, the vertical cavity surface-emitting lasers VCSEL which are the plurality of light emitting elements 110 constituting the light emitting element array 100 emit pulsed light in parallel. The processing unit 30 measures the time difference between the time when the light emitting device 10 emitted light and the time when the light receiving device 20 receives the reflected light from the measurement object 2, thereby calculating the length of light path to the measurement object 2. The positions of the light emitting device 10 and the light receiving device 20 and the interval between them are predetermined. The processing unit 30 calculates the distance to the measurement object 2, from a reference point or the distance from the light emitting device 10 and the light receiving device 20. By the way, the reference point is a point set at a predetermined position from the light emitting device 10 and the light receiving device 20.

This method is a measuring method based on the arrival time of light, and is called the time-of-flight (TOF) method.

By performing this method on a plurality of points of the measurement object 2, the three-dimensional shape of the measurement object 2 is measured. As described above, light emitted from the light emitting device 10 spreads into a two-dimensional space, and falls on the measurement object 2. Then, the reflected light from a part of the measurement object 2 having a short distance from the light emitting device 10 enters the light receiving device 20 quickly. In the case of using the above-mentioned imaging device for acquiring two-dimensional images, in frame images, bright spots are recorded at parts where the reflected light has arrived. From the bright spots recorded in a plurality of consecutive frame images, with respect to each bright spot, the length of light path is calculated. Further, the distance from the reference point, or the light emitting device 10 and the light receiving device 20 is calculated. In other words, the three-dimensional shape of the measurement object 2 is calculated.

By the way, the light emitting element array 100 of the light emitting device 10 has a square shape of, for example, 2 mm by 2 mm to 3 mm by 3 mm. As the irradiation surface 3, a surface which is 1 m away from the light emitting device 10 and has a square shape of 1 m by 1 m is assumed. Therefore, from the perspective of the irradiation surface 3, the light emitting element array 100 may be regarded as a point light source. By treating the light emitting element array 100 as a point light source, it becomes easy to calculate the three-dimensional shape of the measurement object 2 by the reflected light from the individual points of the measurement object 2.

When the measurement object 2 is an article, this optical measuring system 1 may be applied to calculate the distance to the article. Also, this optical measuring system 1 may be applied to identify the article from the three-dimensional shape of the article obtained by the optical measuring system 1. When the measurement object 2 is the face of a person, the optical measuring system may be applied for person identification, i.e. face authentication or the like. Further, this optical measuring system 1 may be mounted on a vehicle to detect obstacles around it, for example, in front of, behind, and beside it. Like this, the optical measuring system 1 may be widely applied to calculate distances, three-dimensional shapes, and so on, and may also be widely applied for information processing using distances and three-dimensional shapes.

(Light Emitting Device 10)

Now, the light emitting device 10 will be described.

Figure 2:
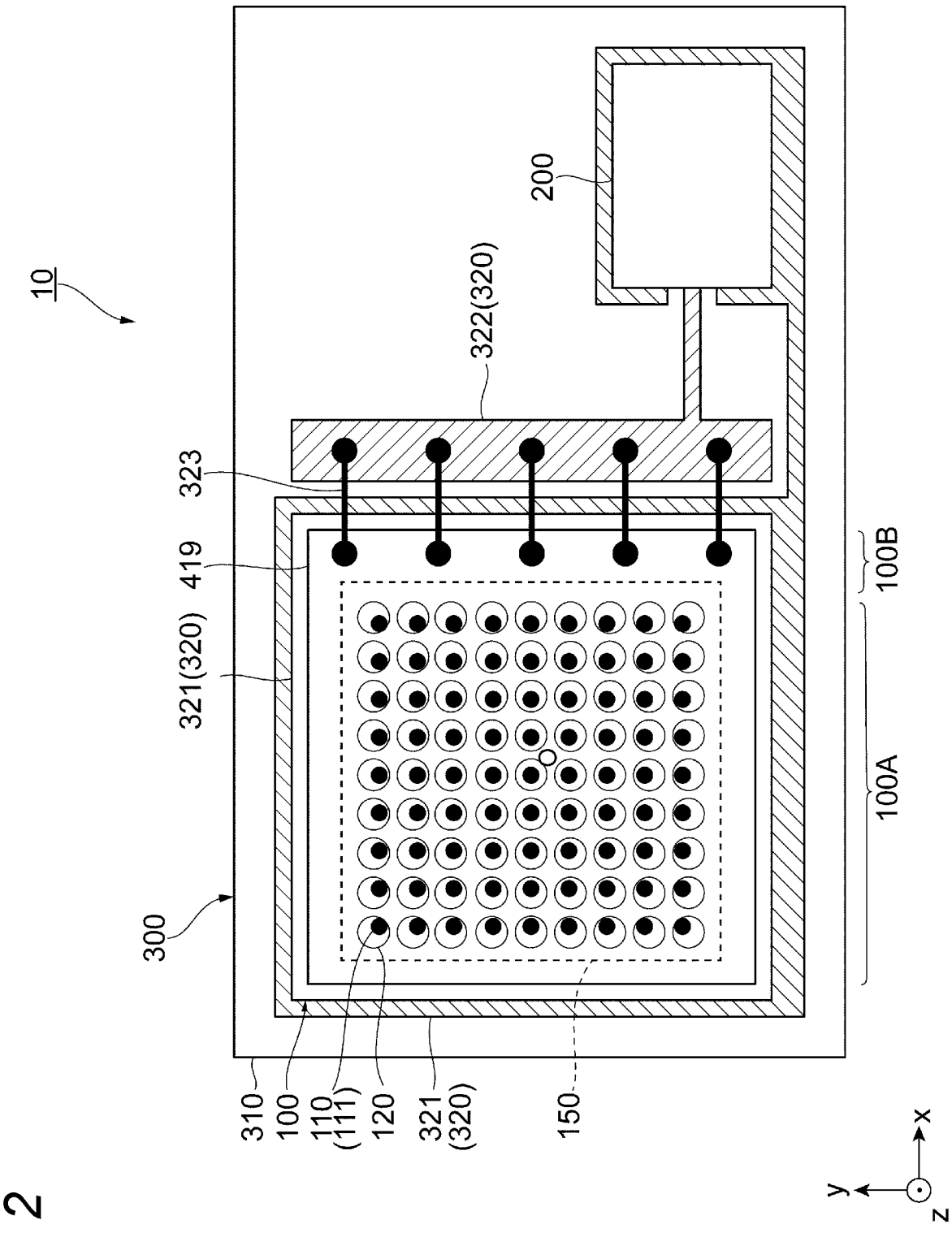
FIG. 2 is a view for explaining a light emitting device.

FIG. 2 is a view for explaining the light emitting device 10. FIG. 2 illustrates a top view of the light emitting device 10. The x direction, the y direction, and the z direction shown in FIG. 2 are the same as those shown in FIG. 1.

The light emitting device 10 includes the light emitting element array 100, a drive circuit 200, and a circuit board 300. The light emitting element array 100 and the drive circuit 200 are provided on the circuit board 300. By the way, although not shown in FIG. 2, the light receiving device 20 and the processing unit 30 shown in FIG. 1 may also be provided on the circuit board 300.

(Light Emitting Element Array 100)

The light emitting element array 100 includes the plurality of light emitting elements 110, and a plurality of lenses 120 provided for every light emitting element 110. In FIG. 2, as an example, eighty-one light emitting elements 110 are arranged in a 9-by-9 matrix at equal intervals in the x direction and the y direction, to constitute a light emitting element group 150 with the center O. The light emitting element array 100 includes the lenses 120 on the surface (light emitting surface) side of the individual light emitting elements 110 for emitting light. As an example, the lenses 120 are convex lenses having the same shape. In this case, as will be described below, the lenses 120 are provided at positions set on the basis of the positions of the light emitting elements 110 in the light emitting element array 100. The lenses 120 are provided to cover the light emitting surfaces of the light emitting elements 110 for emitting light (light emitting surfaces 111 of FIGS. 3A and 3B to be described below), and deflect light which the light emitting elements 110 emit from the light emitting surfaces 111. In FIG. 2, black circles representing the light emitting elements 110 represent the light emitting surfaces 111.

The light emitting elements 110 are, for example, vertical cavity surface-emitting lasers VCSEL made of a III-V compound semiconductor such as GaAs on a substrate of GaAs or the like. The light emitting elements 110 emit, for example, infrared light in the band from 820 nm to 900 nm in the direction perpendicular to the substrate. The plurality of light emitting elements 110 may be monolithically integrated and arranged on one substrate. Hereinafter, light which the light emitting elements 110 emit may be referred to as laser light or light beams.

By the way, although the plurality of light emitting elements 110 has been described as being monolithically integrated on one substrate, the individual light emitting elements 110 may be arranged on a plurality of different substrates.

Also, the light emitting elements 110 may be surface-emitting diodes LED (Light Emitting Diode), instead of the vertical cavity surface-emitting lasers VCSEL. Even in this case, the plurality of surface-emitting diodes LED may be monolithically integrated on one substrate, or the individual surface-emitting diodes LED may be arranged on a plurality of different substrates. The light emitting elements 110 may be edge-emitting elements such as edge-emitting laser elements.

The front surface of the light emitting element array 100 is divided into a light emitting element region 100A where the plurality of light emitting elements 110 is arranged to constitute the light emitting element group 150 and a bonding pad region 100B to which bonding wires 323 are connected, as shown in FIG. 2. On the front surface of the light emitting element array 100, a wiring layer 419 is provided such that p-side electrodes 416 of the plurality of light emitting elements 110 are connected thereto as will be described below. By the way, the wiring layer 419 is provided on the front surface of the light emitting element array 100 except the peripheral part of the light emitting element array 100 and the light emitting surfaces of the light emitting elements 110 for emitting light (the light emitting surfaces 111 of FIG. 3 to be described below). Therefore, on the bonding pad region 100B, the wiring layer 419 is provided.

The number of the plurality of light emitting elements 110 in the light emitting element array 100 is not limited to 9 by 9, and may be any other number. For example, the total number of the plurality of light emitting elements 110 in the light emitting element array 100 may be 300, 400, or the likes. The pitch of the arrangement of the light emitting elements 110 may be set arbitrarily. The pitch of the arrangement of the light emitting elements 110 may be, for example, 40 μm to 200 μm, or the likes. Here, the light emitting elements 110 have been described as being arranged in the x direction and the y direction perpendicular to each other, but do not necessarily need to be arranged in two directions perpendicular to each other. Two directions, i.e. a first arrangement direction and a second arrangement direction may cross each other at an angle other than 90°.

(Circuit Board 300)

The circuit board 300 includes a base body 310 configured with a plate-like insulating member, and wiring 320 provided on one surface of the base body 310. The base body 310 is made of, for example, glass epoxy or the like. The wiring 320 is provided on one surface of the base body 310. The wiring 320 includes a reference wire 321 for supplying a reference voltage, for example, GND, and a power wire 322 for supplying power for light emission to the light emitting element array 100. The circuit board 300 includes the bonding wires 323 which connect the power wire 322 and the light emitting element array 100. The reference wire 321 and the power wire 322 are configured with, for example, copper (Cu) foil provided on the base body 310, and the bonding wires 323 are configured with lines of, for example, aluminum (Al), aurum (Au), or the like.

The light emitting element array 100 is disposed on the reference wire 321 of the circuit board 300. On the back surface of the light emitting element array 100, an n-side electrode 420 (see FIG. 3B to be described below) is provided as will be described below. In other words, the n-side electrode 420 provided on the back surface of the light emitting element array 100 is set to the reference voltage which the reference wire 321 supplies.

Further, the wiring layer 419 of the bonding pad region 100B and the power wire 322 are connected by the bonding wires 323. Here, the plurality of bonding wires 323 is used to secure the amount of current for making the plurality of vertical cavity surface-emitting lasers VCSEL which are examples of the light emitting elements 110 emit light in parallel.

The drive circuit 200 is a driver for supplying power for light emission to the light emitting element array 100. Further, the drive circuit 200 is connected to the processing unit 30 (see FIG. 1), and is controlled by the processing unit 30.

(Structure of Light Emitting Element Array 100)

FIGS. 3A and 3B are enlarged views of a part of the light emitting element array 100. FIG. 3A is a top view of the part of the light emitting element array 100, and FIG. 3B is a cross-sectional view of the part of the light emitting element array 100. They correspond to a right lower part of the light emitting element array 100 shown in FIG. 2.

As described above, the light emitting element array 100 includes the plurality of light emitting elements 110, and the lenses 120 provided for every light emitting element 110, respectively. By the way, one lens 120 needs only to be provided for every one or more light emitting elements 110, and, for example, one lens 120 may be provided for every two or more light emitting elements 110. In other words, "for every light emitting element" includes "for every two or more light emitting elements". Here, the plurality of lenses 120 has been described as having the same shape; however, they may have different shapes.

With reference to the top view of FIG. 3A, the light emitting element array 100 will be described. Each light emitting element 110 of the light emitting element array 100 is configured to have a circular outer shape as seen from above. The center part of the circular shape is a light emitting surface 111. The top surface of the light emitting element array 100 except the light emitting surfaces 111 is covered with the wiring layer 419. By the way, the outer shape of each light emitting element 110 may not be circular, and may be rectangular or polygonal.

Now, the cross section structure of the light emitting element array 100 will be described with reference to the cross-sectional view of FIG. 3B.

Here, the case where the light emitting elements 110 of the light emitting element array 100 are vertical cavity surface-emitting lasers VCSEL will be described. For example, on one surface (hereinafter, referred to as the front surface) of an n-type substrate 410 using GaAs, an n-type lower distributed Bragg reflector layer 411, an active layer 412, an oxidation constriction layer 413, a p-type upper distributed Bragg reflector layer 414, a p-type contact layer 415, the p-side electrodes 416, the interlayer insulating layer 417, a light-emitting-surface protecting layer 418, and the wiring layer 419 are provided. By the way, since distributed Bragg reflector layers are called DBR (distributed Bragg reflector) layers, hereinafter, the n-type lower distributed Bragg reflector layer 411 and the p-type upper distributed Bragg reflector layer 414 are referred to as the "lower DBR layer 411" and the "upper DBR layer 414".

The plurality of light emitting elements 110 in the light emitting element array 100 is separated by so-called mesa etching. In other words, the light emitting elements 110 which are vertical cavity surface-emitting lasers VCSEL have the configuration in which the n-type lower DBR layer 411, the active layer 412, the oxidation constriction layer 413, the p-type upper DBR layer 414, and the contact layer 415 have been stacked in the order on the n-type substrate 410. On the front surfaces (including the side surfaces formed by the mesa etching) except the light emitting surfaces 111 and the p-side electrodes 416, the interlayer insulating layer 417 is provided. As seen from above, the p-side electrodes 416 are provided to surround the light emitting surfaces 111, and the light-emitting-surface protecting layer 418 is provided at the center parts. Further, on the interlayer insulating layer 417 except the light emitting surfaces 111, the wiring layer 419 is provided. Also, the wiring layer 419 is connected to the p-side electrodes 416 of the plurality of light emitting elements 110.

On the other surface (back surface) of the n-type substrate 410, the n-side electrode 420 for ohmic contact with the n-type substrate 410 is provided. By the way, this configuration corresponds to the case of using the n-type substrate, and in the case of using a p-type substrate, the polarities of p and n are reversed, and the directions of voltage and current are reversed.

On the light emitting surfaces 111 of the light emitting elements 110, the lenses 120 are provided. Here, the lenses 120 are shown as convex lenses; however, the lenses 120 need only to be components for deflecting light. In other words, the lenses 120 mean components for deflecting the directions of light which the light emitting elements 110 emit. Therefore, the lenses 120 may be concave lenses, prisms, or the like besides the convex lenses, as will be described below. As shown in FIG. 3B, the distances between the central axes 112 of light emission of the light emitting surfaces 111 of the light emitting elements 110 and the central axes 121 of the lenses 120 are set to vary depending on the positions of the light emitting elements 110 in the light emitting element group 150 of the light emitting element array 100. Also, the central axes of the lenses 120 are the optical axes of the lenses 120. The central axes 112 of light emission of the light emitting elements 110 are axes extending in the directions perpendicular to the light emitting surfaces 111 from the centers of the light emitting surfaces 111. In the case where the light emitting surfaces 111 are circular, the centers of the light emitting surfaces 111 are the centers of the circular shapes, and in the case where the light emitting surfaces 111 have any other shape, the centers of the light emitting surfaces 111 are the gravity centers which are obtained when it is assumed that the light emitting surfaces 111 are plate-like members.

Hereinafter, the configurations of the individual layers shown in FIG. 3B will be described.

The lower DBR layer 411 is configured by alternately stacking semiconductor layers having two different refraction indexes. In other words, in the case where it is assumed that the oscillation wavelength of the light emitting elements 110 which are vertical cavity surface-emitting lasers VCSEL is $\lambda$, and the refraction index of semiconductor layers which are media is n, the semiconductor layers having two different refraction indexes are set such that the thickness of each layer becomes $0.25\lambda/n$. In this case, the lower DBR layer 411 functions as a reflective layer for selectively reflecting light of the wavelength $\lambda$, i.e. a dielectric mirror.

The active layer 412 includes a lower spacer layer 412a, a quantum well active layer 412b, and an upper spacer layer 412c, from the lower DBR layer (411) side (see FIG. 4A to be described below). The quantum well active layer 412b is composed of, for example, four barrier layers formed of GaAs, and three quantum well layers formed of InGaAs between the barrier layers. The lower spacer layer 412a is between the quantum well active layer 412b and the lower DBR layer 411, and the upper spacer layer 412c is between the quantum well active layer 412b and the oxidation constriction layer 413. By the way, the oxidation constriction layer 413 may be regarded as a part of the upper DBR layer 414. The lower spacer layer 412a and the upper spacer layer 412c adjust the length of the resonator between the lower DBR layer 411 and the upper DBR layer 414, and functions as cladding for confining carriers.

The oxidation constriction layer 413 provided on the active layer 412 includes non-oxidized regions 413a and oxidized regions 413b (see FIG. 4C to be described below). By the way, as will be described below, since the oxidized regions 413b are formed from the side surfaces of the mesas, they are formed from the periphery parts of the light emitting elements 110 as seen from above. The center parts become the non-oxidized regions 413a. As will be described below, the oxidized regions 413b are regions where it is difficult for current to flow, and the non-oxidized regions 413a are regions where it is easy for current to flow. The oxidation constriction layer 413 constricts current paths in the light emitting elements 110. Therefore, oscillation of the light emitting elements 110 becomes stable.

The upper DBR layer 414 is configured by alternately stacking semiconductor layers having two different refraction indexes, similarly to the lower DBR layer 411. In other words, the semiconductor layers having two different refraction indexes are set such that the thickness of each layer becomes $0.25\lambda/n$. In this case, the upper DBR layer 414 functions as a reflective layer for selectively reflecting light of the wavelength $\lambda$, i.e. a dielectric mirror. Further, between the upper DBR layer and the lower DBR layer 411, a resonator is formed to confine light of the wavelength $\lambda$.

The contact layer 415 is a layer for facilitating ohmic contact with the p-side electrodes 416.

The p-side electrodes 416 are provided to surround the center parts of the mesas as seen from above. The p-side electrodes 416 are formed of a metal material which may easily come into ohmic contact with the p-type contact layer 415.

The interlayer insulating layer 417 is provided to cover the front surfaces of the light emitting elements 110 (including the side surfaces of the mesas) except parts having the light emitting surfaces 111 and the p-side electrodes 416. The interlayer insulating layer 417 is composed of, for example, a silicon nitride film. However, the interlayer insulating layer 417 may be a silicon oxide ($SiO_2$) film, a silicon oxynitride (SiON) film, or the like, besides the silicon nitride film.

The light-emitting-surface protecting layer 418 is formed of a material having a high transmittance to light of the wavelength $\lambda$ which the active layer 412 emits, on the light emitting surfaces 111 which are the center regions of the mesas surrounded by the p-side electrodes 416 as seen from above. The light-emitting-surface protecting layer 418 is composed of, for example, a silicon nitride (SiN) film. By the way, the interlayer insulating layer 417 and the light-emitting-surface protecting layer 418 may be formed at the same time. In this case, the interlayer insulating layer 417 and the light-emitting-surface protecting layer 418 are formed of the same material.

The wiring layer 419 which is provided on the interlayer insulating layer 417 is provided to cover the front surfaces of the light emitting elements 110 except the light emitting surfaces 111 of the light emitting elements 110. The wiring layer 419 is provided to cover the front surface of the light emitting element array 100 and connect the p-side electrodes 416 of the individual light emitting elements 110 in parallel.

The lenses 120 are provided on parts of the front surface of the wiring layer 419 formed on the light emitting surfaces 111 so as to correspond to the light emitting elements 110, respectively. Here, the lenses 120 are convex lenses as described above. Further, it is assumed that all of the lenses 120 corresponding to the light emitting elements 110 have the same shape. The surfaces of the lenses 120 on the light emitting element (110) side are in contact with the light-emitting-surface protecting layer 418. In other words, the lenses 120 are provided on the light-emitting-surface protecting layer 418. By the way, the periphery parts of the lenses 120 may be extended onto the p-side electrodes 416 over the light emitting surfaces 111.

The lenses 120 are formed on the light emitting surfaces 111 of the light emitting elements 110 provided on the substrate 410. Therefore, the light emitting device 10 is miniaturized as compared to the case of separately providing the array of the lenses 120 and the array of the light emitting element 110 and using the array of the lenses 120 and the array of the light emitting elements 110 in a stacked state. In the case of using the array of the lenses 120 and the array of the light emitting elements 110 in the stacked state, it is required to provide a mechanism for eye safety which restrains light emitted from the light emitting elements 110 from directly entering human eyes without spreading, when the array of the lenses 120 deviates from the array of the light emitting elements 110. However, in the light emitting element array 100 according to the first exemplary embodiment, the lenses 120 are formed on the light emitting surfaces 111 of the light emitting elements 110 provided on the substrate 410, so it is not necessary to provide a mechanism for eye safety, and safety is high.

(Method of Manufacturing Light Emitting Element Array 100)

Now, the method of manufacturing the light emitting element array 100 will be described. By the way, since the light emitting element array 100 is configured by integrating the plurality of light emitting elements 110 on the substrate 410, it will be sufficient to describe the method of manufacturing one light emitting element 110. Therefore, hereinafter, the method of manufacturing the light emitting element array 100 will be described with one light emitting element 110.

FIGS. 4A to 4F are views for explaining the manufacturing method in the case where the light emitting element 110 is a vertical cavity surface-emitting laser VCSEL. FIGS. 4A to 4F illustrate a semiconductor-layer laminate forming process, a mesa etching process, an oxidized-region forming process, a p-side electrode forming process and an interlayer insulating layer forming process, an light-emitting-surface protecting layer forming process and an n-side electrode forming process, and a wiring-layer forming process and a lens forming process, respectively.

Figure 4A:
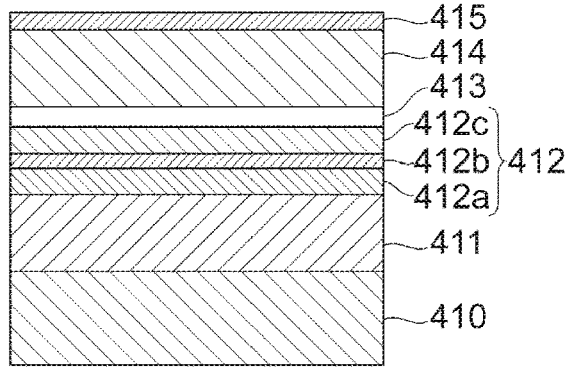

In the semiconductor-layer laminate forming process shown in FIG. 4A, a semiconductor-layer laminate is formed by consecutively stacking the n-type lower DBR layer 411, the active layer 412, the oxidation constriction layer 413, the p-type upper DBR layer 414, and the p-type contact layer 415 on the n-type GaAs substrate 410.

The n-type lower DBR layer 411 is formed by alternately stacking AlAs and GaAs layers having a carrier concentration of $1\times10^{18}$ cm$^{-3}$ thirty times such that the thickness of each layer becomes 0.25λ/n by, for example, a metal-organic chemical vapor deposition (MOCVD) method. By the way, FIG. 4A does not illustrate the n-type lower DBR layer as a multi-layer structure, unlike FIG. 3B.

The active layer 412 is formed by stacking an undoped lower spacer layer 412a of Al$_{0.22}$Ga$_{0.78}$As without impurities, an undoped quantum well active layer 412b, and an undoped upper spacer layer 412c of Al$_{0.22}$Ga$_{0.78}$As. The quantum well active layer 412b is composed of three quantum well layers of InGaAs each of which has a thickness of 80 nm, and four barrier layers of GaAs each of which has a thickness 150 nm. The thickness of the active layer 412 is set to λ/n.

The oxidation constriction layer 413 is AlAs having a carrier concentration of $1\times10^{18}$ cm$^{-3}$. The thickness of the oxidation constriction layer 413 is set to 0.25λ/n.

The upper DBR layer 414 is formed by alternately stacking Al$_{0.9}$Ga$_{0.1}$ As layers and GaAs layers having a carrier concentration of $1\times10^{18}$ cm$^{-3}$ twenty-two times such that the thickness of each layer becomes 0.25λ/n. The total thickness is set to be about 2 μm.

By the way, the oxidation constriction layer 413 may be configured as a part of the upper DBR layer 414.

The p-type contact layer 415 is GaAs having a carrier concentration of $1\times10^{19}$ cm$^{-3}$. The thickness of the p-type contact layer 415 is set to λ/n.

By the way, as a raw material gas for the MOCVD method, trimethylgallium, trimethylaluminum, trimethylindium, and arsine may be used. Also, as impurity (dopant) materials, cyclopentadinium magnesium and silane may be used for p-type and n-type, respectively. The semiconductor-layer laminate is formed by setting the temperature of the substrate to 750° C. and consecutively stacking the individual layers while sequentially switching the raw material gases without breaking vacuum.

Figure 4B:
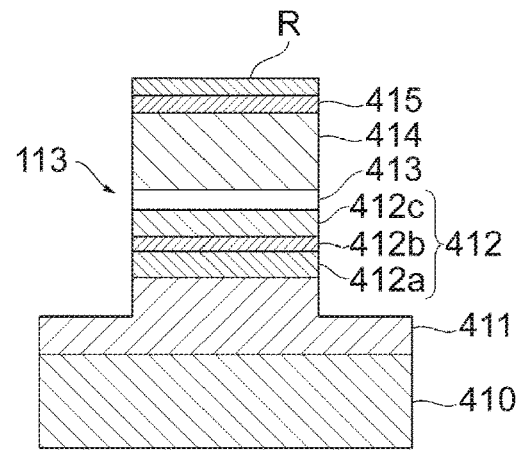

In the mesa etching process shown in FIG. 4B, a mesa 113 is formed by etching the above-mentioned semiconductor-layer laminate to the middle of the lower DBR layer 411. Here, the oxidation constriction layer 413 of AlAs is exposed. In other words, the mesa 113 is formed by forming an etching mask (resist mask) R of a photoresist on the part to be the light emitting element 110 by photolithography and performing reactive ion etching using carbon tetrachloride (CCl$_4$) as etching gas.

Figure 4C:
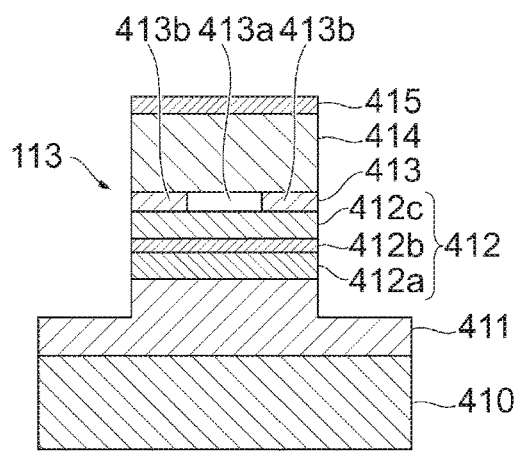

In the oxidized-region forming process of FIG. 4C, an oxidized region 413b is formed by oxidizing the oxidation constriction layer 413 of AlAs. In other words, after the resist mask R is removed, the oxidation constriction layer 413 of AlAs is oxidized from the side surface of the mesa 113 by performing steam oxidation in a furnace at about 400° C. The oxidized periphery part of the mesa 113 becomes an oxidized region 413b, and the non-oxidized center part of the mesa 113 becomes a non-oxidized region 413a. In the oxidized region 413b, since AlAs has been oxidized to contain insulating Al$_2$O$_3$, it becomes difficult for current to flow. Meanwhile, the non-oxidized region 413a remains as a region where it is easy for current to flow, i.e. a current injection region.

Figure 4D:
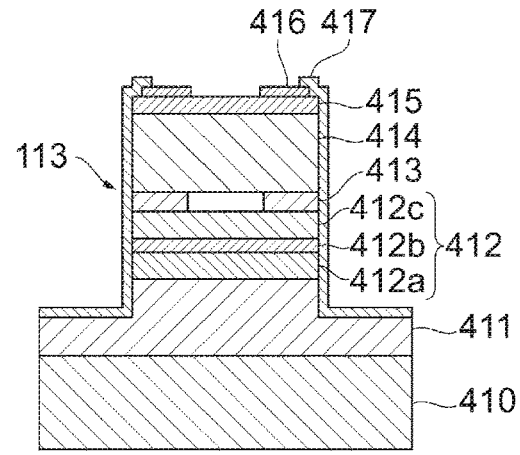

Of the p-side electrode forming process and the interlayer insulating layer forming process of FIG. 4D, in the p-side electrode forming process, a p-side electrode 416 is formed to surround the center part of the front surface of the mesa 113. In other words, after a resist mask is formed except the part where the p-side electrode 416 will be formed, a metal material to be the p-side electrode 416 is deposited by vacuum deposition or the like. Then, the p-side electrode 416 is formed by a so-called lift-off method of removing the metal material deposited on the resist mask together with the resist mask. As a result, on the part for forming the p-side electrode 416, the metal material to be the p-side electrode 416 remains. For the p-side electrode 416, Ti/Au which may easily come into ohmic contact with p-type GaAs may be used.

Of the p-side electrode forming process and the interlayer insulating layer forming process of FIG. 4D, in the interlayer insulating layer forming process, the interlayer insulating layer 417 is deposited except for the p-side electrode 416 and the region surrounded by the p-side electrode 416 and to be the light emitting surface 111. In other words, similarly to the formation of the p-side electrode 416, a resist mask is formed on the p-side electrode 416 and the region surrounded by the p-side electrode 416 and to be the light emitting surface 111, and then silicon nitride (SiN) to be the interlayer insulating layer 417 is deposited by vacuum deposition or the like. Then, the silicon nitride deposited on the resist mask is removed together with the resist mask, whereby the interlayer insulating layer 417 is formed on the front surface of the light emitting element array 100 including the side surface of the mesa 113.

Figure 4E:
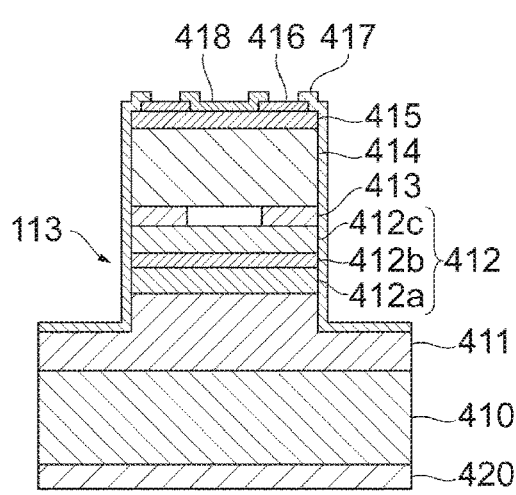

Of the light-emitting-surface protecting layer forming process and the wiring-layer forming process of FIG. 4E, in the light-emitting-surface protecting layer forming process, the light-emitting-surface protecting layer 418 is formed on the region surrounded by the p-side electrode 416. In other words, a resist mask is formed except the region surrounded by the p-side electrode 416 and to be the light emitting surface 111, and then silicon nitride (SiN) to be the light-emitting-surface protecting layer 418 is deposited by vacuum deposition or the like. Then, the silicon nitride deposited on the resist mask is removed together with the resist mask (lift-off). In this way, the light-emitting-surface protecting layer 418 is formed on the region surrounded by the p-side electrode 416.

Of the light-emitting-surface protecting layer forming process and the n-side electrode forming process of FIG. 4E, in the n-side electrode forming process, the n-side electrode 420 is formed on the back surface of the substrate 410. In other words, on the back surface side of the substrate 410, a metal material to be the n-side electrode 420 is deposited by vacuum deposition or the like. For the n-side electrode 420, Au/Ge which may easily come in ohmic contact with n-type GaAs may be used.

Figure 4F:
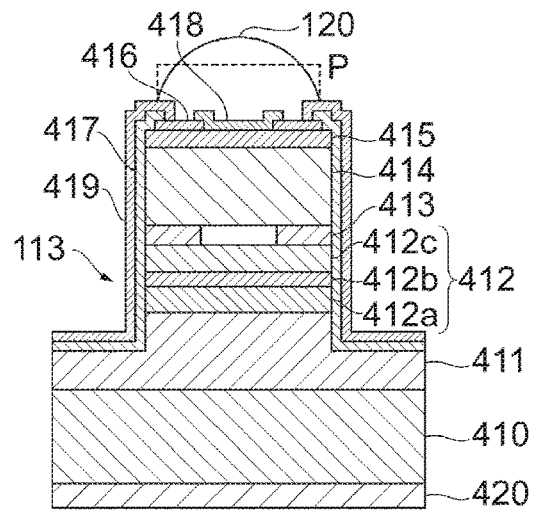

Of the wiring-layer forming process and the lens forming process of FIG. 4F, in the wiring-layer forming process, the wiring layer 419 is formed except the light emitting surface 111 so as to connect the p-side electrode 416 to the front surface. The wiring layer 419 is formed to cover the front surface of the light emitting element array 100 except the light emitting surface 111 as described above.

Of the wiring-layer forming process and the lens forming process of FIG. 4F, in the lens forming process, a lens 120 is formed of a photoresist on the light emitting surface 111. In other words, on a part of the light emitting surface 111 for forming the lens 120, a resist pattern P (the shape shown by the broken line) is formed of a photoresist. Then, if the resist pattern P is heated to the flow temperature or a higher temperature, causing viscous flowing of the resist pattern P, the front surface of the resist pattern P becomes a convex shape (the shape shown by the solid line) by surface tension, whereby the lens 120 is formed. By the way, the lens 120 may be configured with a material generating viscous flowing, other than the photoresist, as long as the material transmits light which is emitted from the light emitting element 110.

Also, the lens 120 may be formed using a stamp which is a mold for the shape of the lens 120, instead of using viscous flowing. For example, the mold containing the material to form the lens 120 may be pressed against the substrate 410 having the light emitting element 110 formed thereon, such that the lens 120 is transferred onto the substrate 410.

Figure 5A:
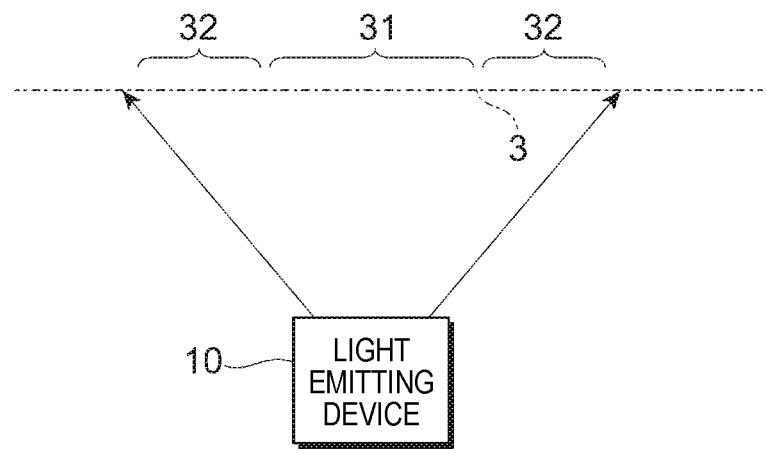
Figure 5B:
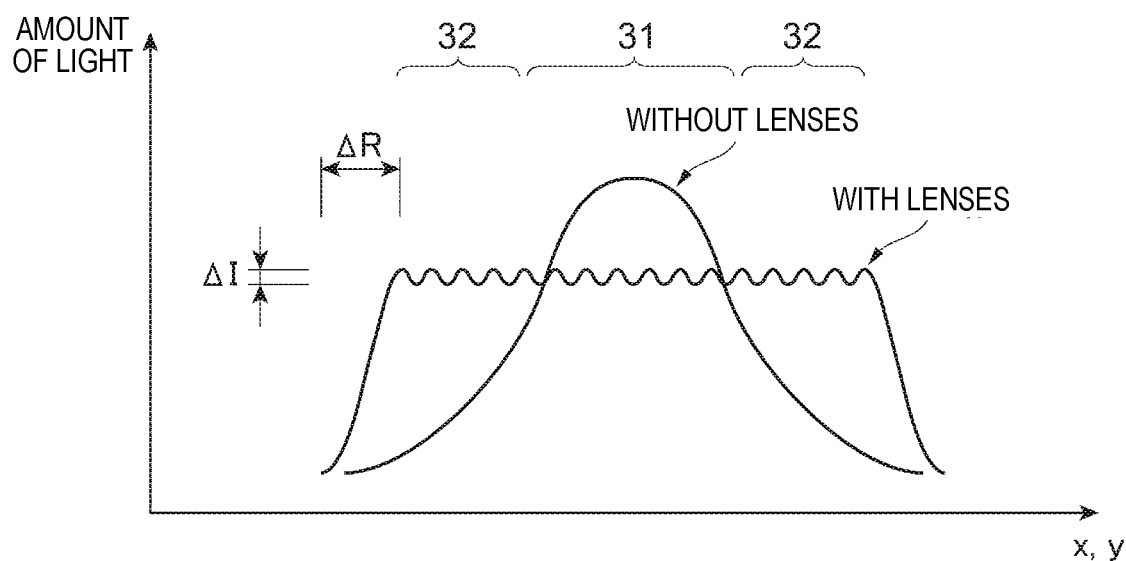

Now, the action of the lenses 120 in the light emitting element array 100 will be described. FIGS. 5A and 5B are views for explaining the amount of light on the irradiation surface 3 which is irradiated with light by the light emitting element array 100. FIG. 5A is a view for explaining a state where light is radiated toward the irradiation surface 3 by the light emitting element array 100, and FIG. 5B is a view for explaining the amount of light on the irradiation surface 3. Here, the case where there is no lenses 120 is expressed as the phrase "Without Lenses", and the case where there are the lenses 120 is expressed as the phrase "With Lenses".

As described above, the light emitting element array 100 of the light emitting device 10 has a square shape having the size of, for example, 2 mm by 2 mm to 3 mm by 3 mm, and the irradiation surface 3 is a virtual square area of about 1 m by 1 m, 1 m away from the light emitting device 10. Therefore, as shown in FIG. 5A, the light emitting element array 100 is smaller than the irradiation surface 3.

Also, the light emitting elements 110 of the light emitting element array 100 are vertical cavity surface-emitting lasers VCSEL, and emit laser light. In other words, the vertical cavity surface-emitting lasers VCSEL emit light having directivity in the direction perpendicular to the substrate 410.

Therefore, in the light emitting element array 100 without the lenses 120, the center part 31 of the irradiation surface 3 facing the light emitting element array 100 is irradiated with high-intensity light due to the directivity of the vertical cavity surface-emitting lasers VCSEL; whereas the end part 32 of the irradiation surface 3 far from the center part 31 of the irradiation surface 3 is irradiated with only low-intensity light traveling in the oblique direction from the light emitting elements 110.

In other words, as shown by "Without Lenses" in FIG. 5B, the amount of light has a distribution in which the amount of light is large at the center part 31 and rapidly decreases as it goes toward the end part 32.

Therefore, in the first exemplary embodiment, in the light emitting element array 100, the lenses 120 are provided for every light emitting element 110. In other words, by deflecting the optical path of light which is emitted by the vertical cavity surface-emitting lasers VCSEL which are the light emitting elements 110 by the lenses 120, change in the amount of light on the irradiation surface between the center part 31 and the end part 32 is decreased as compared to the "Without Lenses" case where there is no lenses 120. As shown by "With Lenses" in FIG. 5B, since the lenses 120 are provided on the light emitting surfaces 111 of the vertical cavity surface-emitting lasers VCSEL which are the light emitting elements 110, the amount of light which is radiated from the light emitting element group 150 onto the center part 31 decreases, and the amount of light which is radiated onto the end part 32 increases.

It is preferable that change ΔI in the amount of light on the center part 31 and the end part 32 of the irradiation surface 3 should be small. Also, it is desirable that variation in the amount of light should be steep at the boundary ΔR between the end part 32 and the outside region.

Figure 6:
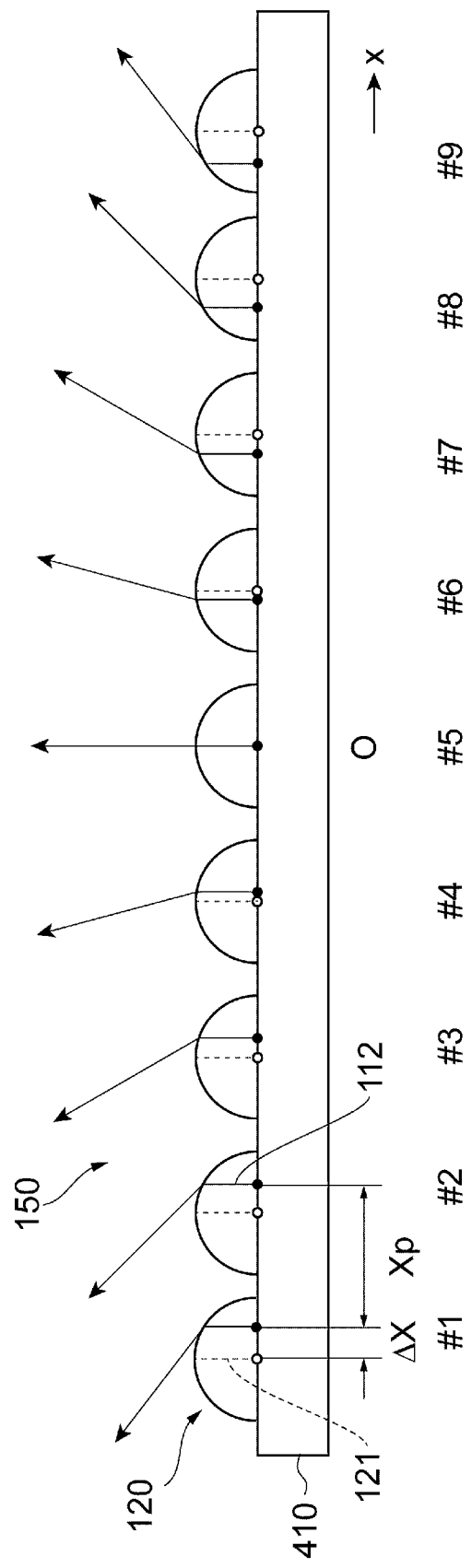
FIG. 6 is a view for explaining an example of a method of deflecting light emitted from the light emitting elements by lenses according to the first exemplary embodiment.

FIG. 6 is a view for explaining an example of the method of deflecting light which the light emitting elements 110 emit by the lenses 120 according to the first exemplary embodiment. The positions of the central axes 112 of light emission of the light emitting elements 110 on the surface of the substrate 410 are shown by black circles, and the positions of the central axes 121 of the lenses 120 on the surface of the substrate 410 are shown by white circles. Here, an example having nine light emitting elements 110 (#1 to #9) positioned around the center O of the light emitting element group 150 and arranged in the x direction and lenses 120 as shown in FIG. 2 will be described. Light Emitting Element #5 of the light emitting elements 110 is arranged at the center O, and Light Emitting Elements #1 to #4 of the light emitting elements 110 and Light Emitting Elements #6 to #9 of the light emitting elements 110 are arranged on the left and right sides of the center O, respectively.

It is assumed that the light emitting elements 110, i.e. the central axes 112 of light emission shown by the black circles are arranged in the x direction at an arrangement pitch Xp. On the other hand, the white circles indicating the central axes 121 of the lenses 120 are provided to deviate from the center (O) side of the light emitting element group 150 to the end side of the light emitting element group 150 as it goes from the periphery part of the substrate 410. Therefore, light emitted from the central axes 112 of light emission deflects to spread in the left-right direction of FIG. 6, i.e. to the outer side. Since the lenses 120 are provided for the light emitting elements 110, light emitted from the light emitting element array 100 is spread from the center part 31 to the end part 32 of the irradiation surface 3 shown in FIGS. 5A and 5B. Here, the distance between a central axis 112 of light emission and the central axis 121 of a lens 120 is denoted by ΔX. With respect to Light Emitting Element #5 of the light emitting elements 110 positioned at the center O, ΔX is "0". With respect to central light emitting elements 110 close to Light Emitting Element #5, ΔX is small, and as it goes away from #5 of the light emitting elements 110, ΔX increases. With respect to Light Emitting Element #1 to #4 of the light emitting elements 110 arranged on the left side from the center O, the central axes 121 of the lenses 120 deviate from the central axes 112 of light emission to the negative side of the x direction. Therefore, with respect to Light Emitting Element #1 to #4 of the light emitting elements 110, ΔX is referred to as being negative, for convenience. Meanwhile, with respect to Light Emitting Element #6 to #9 of the light emitting elements 110 positioned on the right side from the center O, the central axes 121 of the lenses 120 deviate from the central axes 112 of light emission to the positive of the x direction. Therefore, with respect to Light Emitting Element #6 to #9 of the light emitting elements 110, ΔX is referred to as being positive, for convenience. Further, the difference in distance ΔX between adjacent light emitting elements 110 is referred to as the amount of change, and the inclination of the amount of change is referred to as the degree of change. For example, the amount of change in distance ΔX is ΔX(n)−ΔX(n+1) (wherein n is one of #1 to #8). The degree of change is the inclination of the amount of change between consecutive n values, and is, for example, the difference between ΔX(#1)−ΔX(#2) and ΔX(#2)−ΔX(#3).

Although not described herein, it is assumed that the light emitting elements 110, i.e. the central axes 112 of light emission are arranged in the y direction at an arrangement pitch Yp, and the distances in the y direction between the central axes 112 of light emission and the central axes 121 of the lenses 120 are ΔY.

Now, comparative examples and examples having deflected light by the lenses 120 in the light emitting element array 100 will be described. Here, the light emitting elements 110 which are included in the light emitting element array 100 were arranged in a 12-by-9 matrix in the x direction and the y direction at an interval (pitch) of 200 μm. The spreading angle of light from each light emitting element 110 was set to 15°, and the amount of light on an irradiation surface 3 which was 1 m away from the light emitting element array 100 was obtained by a simulation. Further, the amount of light is shown in gray scale such that whiter parts indicate larger amounts of light.

FIGS. 7A and 7B are views for explaining comparative examples related to the effect of the distances between the central axes 121 of the lenses 120 and the central axes 112 of light emission of the light emitting elements 110 in the light emitting element array 100. FIG. 7A is a view for explaining a first comparative example having no lenses 120, and FIG. 7B is a view for explaining a second comparative example in which the distances ΔX in the x direction between the central axes 121 of the lenses 120 and the central axes 112 of light emission and the distances ΔY in the y direction between them are changed linearly as it goes from the center (O) side toward the end side.

The first comparative example shown in FIG. 7A has no lenses 120. In this case, bright sports are shown at the center part of the irradiation surface 3. The bright spots correspond to the center part 31 shown in FIGS. 5A and 5B. In other words, the bright part on the irradiation surface 3 has a stop shape and is narrow.

In the second comparative example shown in FIG. 7B, the distances ΔX in the x direction between the central axes 121 of the lenses 120 and the central axes 112 of light emission and the distances ΔY in the y direction between them are changed linearly as it goes from the center (O) side toward the end side. Further, in the graph shown on the right side of FIG. 7B, the horizontal axis represents the numbers n (e.g. #1 in FIG. 6 where "#" is omitted) of the light emitting elements 110 arranged in the x direction and the y direction, and the vertical axis represents the ratios of the distances ΔX and the distances ΔY between the central axes 121 of the lenses 120 and the central axes 112 of light emission corresponding to the numbers # of the light emitting elements 110 to the arrangement pitches Xp and Yp (ΔX/Xp and ΔY/Yp). Furthermore, in the arrangement of the light emitting elements 110, ΔX/Xp and ΔY/Yp were set to be smaller on the center (O) side of the light emitting element group 150 and be larger on the end side.

Here, unlike FIG. 6, the number of light emitting elements 110 in the x direction is 12, not 9. Therefore, at the center O, there is no light emitting element 110. Further, although nine light emitting elements are arranged in the y direction, it is assumed that twelve light emitting elements are arranged. Furthermore, with respect to the twenty light emitting elements 110, the ratios ΔX/Xp and ΔY/Yp of the distances between the central axes 121 of the lenses 120 and the central axes 112 of light emission are set to become 0.025 at the left end (in this case, Light Emitting Element #1) and the right end (in this case, Light Emitting Element #12) with respect to the center O. In other words, the distance between both ends of the central axes 121 of the lenses 120 in the x direction (the lens 120 corresponding to Light Emitting Element #1 of the light emitting elements 110 and the lens 120 corresponding to Light Emitting Element #12 of the light emitting elements 110) becomes 105% of the distance between both ends of the central axes 112 of light emission of the light emitting elements 110 (Light Emitting Element #1 of the light emitting elements 110 and Light Emitting Element #12 of the light emitting elements 110).

As seen from the graph shown on the right side of FIG. 7B, the degrees of change (change amount inclinations) in the distances ΔX in the x direction between the central axes 112 of light emission and the central axes 121 of the lenses 120 and the distances ΔY in the y direction between them are constant. For example, ΔX(#1)−ΔX(#2) and ΔX(#2)−ΔX(#3) are equal. The same is true for the other parts.

In this case, as shown on the left side of FIG. 7B, the region of the center part 31 of the irradiation surface 3 where the amount of light is large expands toward the end part 32, but the rate at which the amount of light changes from the end part 32 toward the outside of the end part 32.

FIGS. 8A to 8C are views for explaining examples related to the effect of the distances between the central axes 121 of the lenses 120 and the central axes 112 of light emission of the light emitting elements 110 in the light emitting element array 100. FIG. 8A is a view for explaining a first example in which the distances ΔX in the x direction between the central axes 121 of the lenses 120 and the central axes 112 of light emission are changed by a cosine function as it goes from the center (O) side toward the end side, and the distances ΔY in the y direction between them are changed linearly as it goes from the center (O) side toward the end side. FIG. 8B is a view for explaining a second example in which not only the distances ΔX in the x direction between the central axes 121 of the lenses 120 and the central axes 112 of light emission but also the distances ΔY in the y direction between them are changed by a cosine function as it goes from the center (O) side toward the end side. FIG. 8C is a view for explaining a third example in which the distances ΔX in the x direction between the central axes 121 of the lenses 120 and the central axes 112 of light emission are changed by a cosine function as it goes from the center (O) side toward the end side, and the distances ΔY in the y direction between them are changed by the averages of the values of a cosine function and a linear function as it goes from the center (O) side toward the end side.

In the first example of FIG. 8A, the distances ΔX in the x direction between the central axes 121 of the lenses 120 and the central axes 112 of light emission are changed by the cosine function as it goes from the center (O) side toward the end side, and the distances ΔY in the y direction are changed linearly as it goes from the center (O) side toward the end side.

A graph shown on the right side of FIG. 8A is made in the same way as that for the graph shown on the right side of FIG. 7B. The distances ΔX in the x direction are changed by the cosine function as it goes from the center (O) side toward the end side, such that the amount of change in the distances Δ between the central axes 121 of the lenses 120 and the central axes 112 of light emission of the light emitting elements 110 becomes larger on the center (O) side of the light emitting element group 150 and the amount of change in the distances between the central axes 121 of the lenses 120 and the central axes 112 of light emission of the light emitting elements 110 becomes smaller on the end side of the light emitting element group 150. For example, in the graph shown on the right side of FIG. 8A, ΔX(#6)−ΔX(#5) is larger than ΔX(#5)−ΔX(#4). Also, ΔX(#5)−ΔX(#4) is larger than ΔX(#4)−ΔX(#3). In other words, with respect to Light Emitting Element #1 to #5 of the light emitting elements 110 positioned on the left side from the center (O) side, the degree of change in the change amount ΔX(n+1)−ΔX(n) (the inclination of the amount of change) increases as n increases. Meanwhile, with respect to Light Emitting Element #7 to #11 of the light emitting elements 110 positioned on the right side from the center (O) side, the degree of change in the change amount ΔX(n+1)−ΔX(n) (the inclination of the amount of change) decreases as n decreases.

Therefore, as shown in the left-side view of FIG. 8A, as compared to the left-side view of FIG. 7B, the region on the irradiation surface 3 where the amount of light is large expands in the x direction, and change in the amount of light from the end part 32 toward the outside of the end part 32 in the x direction becomes steep (see FIGS. 5A and 5B).

The reason is that on the center (O) side of the light emitting element group 150, the amount of change in the distances Δ between the central axes 121 of the lenses 120 and the central axes 112 of light emission of the light emitting elements 110 is increased such that the amount of light which reaches the center part 31 of the irradiation surface 3 decreases, and on the end side of the light emitting element group 150, the amount of change in the distances Δ between the central axes 121 of the lenses 120 and the central axes 112 of light emission of the light emitting elements 110 is decreased such that the amount of light which reaches the end part 32 of the irradiation surface 3 increases.

In the second example of FIG. 8B, not only the distances ΔX in the x direction between the central axes 121 of the lenses 120 and the central axes 112 of light emission but also the distances ΔY in the y direction between them are changed by the cosine function as it goes from the center (O) side toward the end side.

By the way, a graph shown on the right side of FIG. 8B is made in the same way as that for the graph shown on the right side of FIG. 7B.

Therefore, as shown in the left-side view of FIG. 8B, as compared to the left-side view of FIG. 8A, even in the y direction, the region of the irradiation surface 3 where the amount of light is large expands, and change in the amount of light from the end part 32 toward the outside of the end part 32 becomes steep. The reason is that on the center (O) side of the light emitting element group 150, the degree of change (the inclination of the amount of change) in the distances Δ between the central axes 121 of the lenses 120 and the central axes 112 of light emission of the light emitting elements 110 is increased, and on the end side of the light emitting element group 150, the degree of change (the inclination of the amount of change) in the distances Δ between the central axes 121 of the lenses 120 and the central axes 112 of light emission of the light emitting elements 110 is decreased. However, at the center part 31, a decrease in the amount of light is shown.

In the third example of FIG. 8C, the distances ΔX in the x direction between the central axes 121 of the lenses 120 and the central axes 112 of light emission are changed by the cosine function as it goes from the center (O) side toward the end side, and the distances ΔY in the y direction are changed by the averages of the values of the cosine function and the linear function as it goes from the center (O) side toward the end side.

By the way, a graph shown on the right side of FIG. 8C is made in the same way as that for the graph shown on the right side of FIG. 7B.

Therefore, as shown in the left-side view of FIG. 8C, as compared to the left-side view of FIG. 8B, the decrease in the amount of light at the center part 31 of the irradiation surface 3 is suppressed, and the rectangular region where the amount of light is large is obtained. Also, change in the amount of light from the end part 32 toward the outside of the end part 32 becomes steep. The reason is that on the center (O) side of the light emitting element group 150, the degree of change (the inclination of the amount of change) in the distances Δ between the central axes 121 of the lenses 120 and the central axes 112 of light emission of the light emitting elements 110 is increased, and on the end side of the light emitting element group 150, the degree of change (the inclination of the amount of change) in the distances Δ between the central axes 121 of the lenses 120 and the central axes 112 of light emission of the light emitting elements 110 is decreased.

As described above, the lenses 120 are provided on the light emitting surfaces 111 of the light emitting elements 110, such that as it goes from the center (O) side toward the end side of the light emitting element group 150, the distances (ΔX and/or ΔY) between the central axes 121 of the lenses 120 and the central axes 112 of light emission of the light emitting elements 110 increase, and the degree of change decreases. Therefore, on the irradiation surface 3, the region where the change in the amount of light is less expands from the center part 31 toward the end part 32, and the change in the amount of light from the end part 32 of the irradiation surface 3 toward the outside of the end part 32 becomes steep. For example, when the distances (ΔX or/and ΔY) between the central axes 121 of the lenses 120 and the central axes 112 of light emission of the light emitting elements 110 are set by a nonlinear relation such as a cosine function, the region on the irradiation surface 3 where the change in the amount of light is less expands, and the change in the amount of light from the end part 32 of the irradiation surface 3 toward the outside of the end part 32 becomes steep. By the way, the cosine function is an example, and other functions may be used, and a relation which is not describable with a function may be set.

Second Exemplary Embodiment

In the first exemplary embodiment, as shown in FIG. 6, with respect to the central axes 112 of light emission of the light emitting elements 110, the central axes 121 of the lenses 120 deviate to the end side of the light emitting element group 150 as it goes from the center (O) side of the light emitting element group 150 toward the end side.

In a second exemplary embodiment, with respect to the central axes 112 of light emission of the light emitting elements 110, the central axes 121 of the lenses 120 deviate to the center (O) side of the light emitting element group 150 as it goes from the center (O) side of the light emitting element group 150 toward the end side.

Figure 9A:
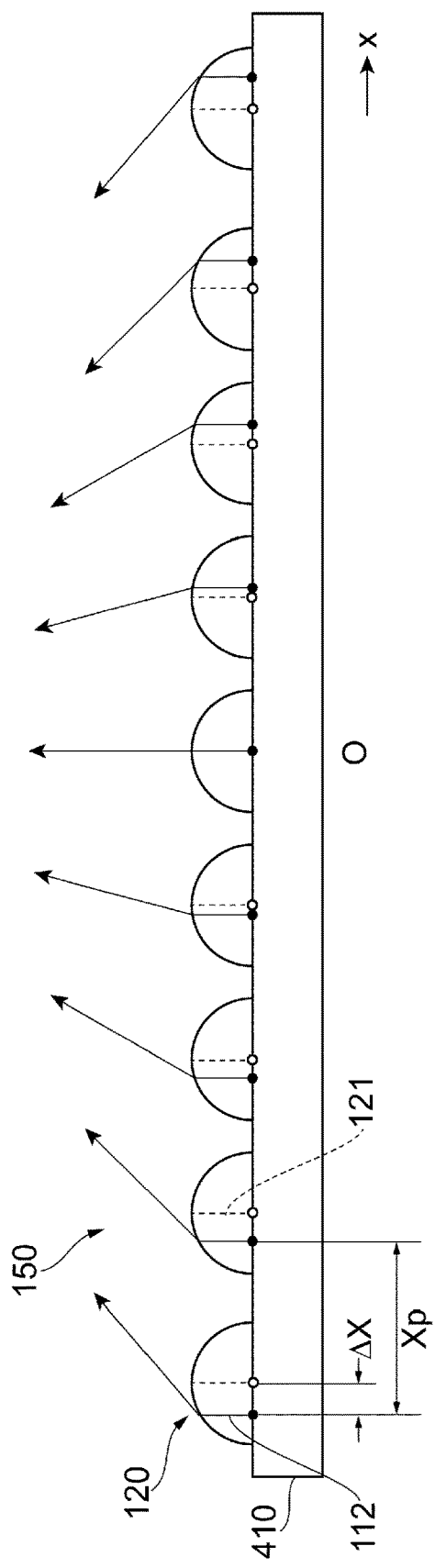
Figure 9B:
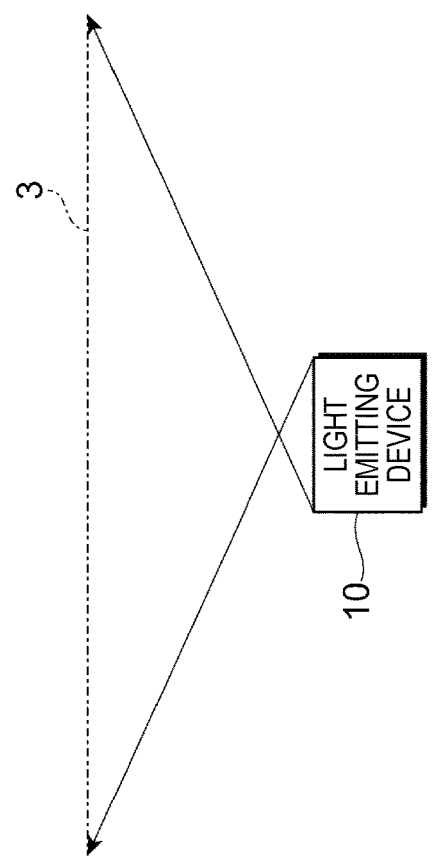

FIGS. 9A and 9B are views for explaining an example of the method of deflecting light which the light emitting elements 110 emit by the lenses 120 according to the second exemplary embodiment. FIG. 9A is a view for explaining the relation between the light emitting elements 110 and the lens 120 in the light emitting element array 100, and FIG. 9B is a view for explaining light which travels from the light emitting device 10 to the irradiation surface 3. Even in FIG. 9A, the positions of the central axes 112 of light emission of the light emitting elements 110 on the front surface of the substrate 410 are shown by black circles, and the positions of the central axes 121 of the lenses 120 on the front surface of the substrate 410 are shown by white circles.

By the way, since the other configuration is identical to that of the first exemplary embodiment, a description thereof will not be made.

As shown in FIG. 9A, the positions of the central axes 112 of light emission of the light emitting elements 110 shown by the black circles are arranged on the substrate 410 at equal intervals. On the other hand, the white circles indicating the positions of the central axes 121 of the lenses 120 are provided to deviate to the inner side of the light emitting element group 150 as it goes from the center (O) side of the light emitting element group 150 toward the end side. In this case, light emitted from the central axes 112 of light emission of the light emitting elements 110 deflects so as to first converge in the direction in which the light emitted from the center O of the light emitting element group 150 travels.

However, as shown in FIG. 9B, the light spreads again, and falls on the irradiation surface 3.

Therefore, similarly in the first exemplary embodiment, when the lenses 120 are provided on the light emitting surfaces 111 of the light emitting elements 110 such that as it goes from the center (O) side of the light emitting element group 150 toward the end side, the distances between the central axes 121 of the lenses 120 and the central axes 112 of light emission of the light emitting elements 110 increase, and the degree of change in the distances decreases, on the irradiation surface 3, on the irradiation surface 3, the region where the change in the amount of light is less expands, and the change in the amount of light to the end part 32 of the irradiation surface 3 and the outside of the end part 32 becomes steep.

Third Exemplary Embodiment

In the first and second exemplary embodiments, convex lenses are used as the lenses 120.

In the third exemplary embodiment, lenses 130 which are concave lenses are used.

Figure 10A:
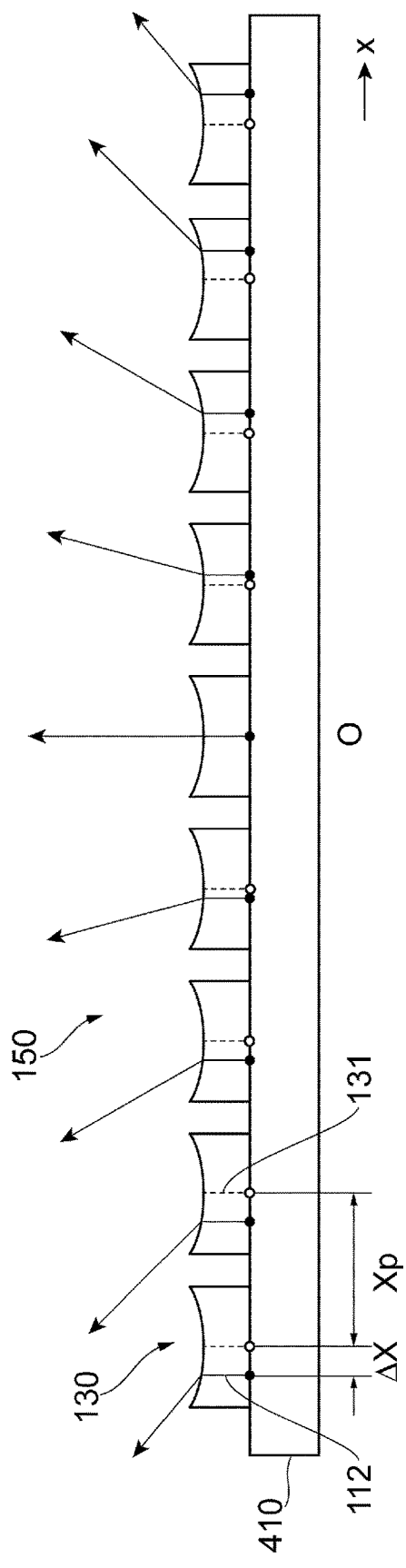
Figure 10B:
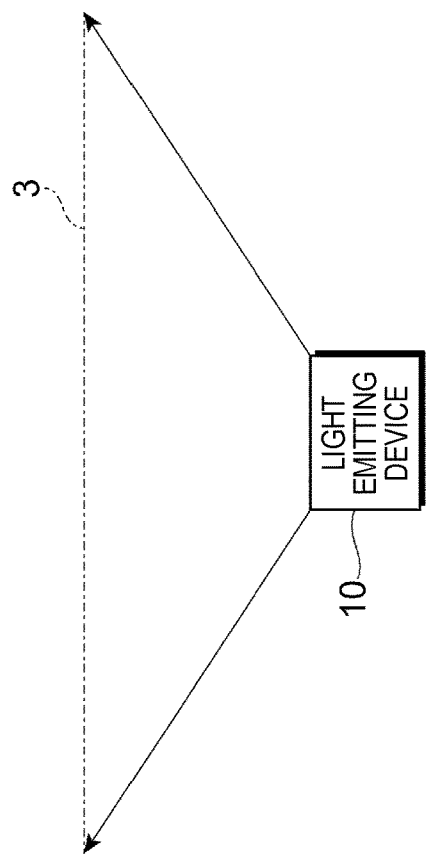

FIGS. 10A and 10B are views for explaining an example of deflecting light which the light emitting elements 110 emit by the lenses 130 according to the third exemplary embodiment. FIG. 10A is a view for explaining the relation between the light emitting elements 110 and the lenses 130 in the light emitting element array 100, and FIG. 10B is a view for explaining light which travels from the light emitting device 10 to the irradiation surface 3. Even in FIG. 10A, the positions of the central axes 112 of light emission of the light emitting elements 110 on the substrate 410 are shown by black circles, and the positions of the central axes 131 of the lenses 130 on the substrate 410 are shown by white circles.

Since the other configuration is identical to that of the first exemplary embodiment, a description thereof will not be made.

As shown in FIG. 10A, the light emitting elements 110, i.e. the central axes 112 of light emission shown by the black circles are arranged on the substrate 410 at equal intervals. On the other hand, the white circles indicating the central axes 131 of the lenses 130 are provided to deviate to the inner side of the light emitting element group 150 as it goes from the center (O) side of the light emitting element group 150 toward the end side. In this case, light emitted from the positions of the central axes 112 of light emission of the light emitting elements 110 shown by the black circles deflects to spread in the left-right direction of FIGS. 10A and 10B, i.e. to the outer side.

In other words, as shown in FIG. 10B, the light emitted from the light emitting element group 150 spreads from the light emitting element group 150, and falls on the irradiation surface 3, similarly to the case of the lenses 120 using the convex lenses of FIG. 6 and FIGS. 9A and 9B.

Therefore, similarly in the first exemplary embodiment, when the lenses 130 are provided on the light emitting surfaces 111 of the light emitting elements 110 such that as it goes from the center (O) side of the light emitting element group 150 toward the end side, the distances between the central axes 131 of the lenses 130 and the central axes 112 of light emission of the light emitting elements 110 increase, and the degree of change in the distances decreases, on the irradiation surface 3, the region where the change in the amount of light is less expands, and the change in the amount of light to the end part 32 of the irradiation surface 3 and the outside of the end part 32 becomes steep.

In the light emitting element arrays 100 according to the first exemplary embodiment to the third exemplary embodiment, the central axes 112 of light emission of the light emitting elements 110 are arranged on the substrate 410 at equal intervals; however, the central axes 121 of the lenses 120 or the central axes 131 of the lenses 130 may be arranged on the substrate 410 at equal intervals. Also, not only the central axes 112 of light emission of the light emitting elements 110 but also either the central axes 121 of the lenses 120 or the central axes 131 of the lenses 130 may not be arranged at equal intervals. Any arrangement for expanding the region where the change in the amount of light is less on the irradiation surface 3 may be used. Change in the amount of light between the end part 32 of the irradiation surface 3 and the outside of the end part 32 needs only to be steep.

The degree of change in the distances may be set to vary depending on the arrangement of the light emitting elements 110 in the x direction and the arrangement of them in the y direction. In this case, an irradiation profile different from that which is obtained in the case where the degree of change in one arrangement direction which is the x direction is the same as that in the other arrangement direction which is the y direction is obtained. By the way, even in the case of arranging the light emitting elements 110 in a first arrangement direction and a second arrangement direction which are not perpendicular to the x direction and the y direction, the degree of change in the distances may be set to vary. In this case, an irradiation profile different from that which is obtained in the case where the degree of change in the distances in the first arrangement direction is the same as that in the second arrangement direction is obtained.

Also, in the first to third exemplary embodiments, the lenses 120 and 130 have circular planar shapes; however, parts for serving as the lenses 120 or 130 may be provided only at parts through which light which is emitted from the light emitting elements 110 passes.

Also, in the light emitting element arrays 100 according to the first to third exemplary embodiments, the light emitting elements 110 are arranged two-dimensionally; however, they may be arranged one-dimensionally. The light distribution characteristic of the light emitting elements 110 and orientation using the lenses 120 may be used to expand the region on the irradiation surface 3 where change in the amount of light is less.

By the way, in the case of using the light emitting element arrays 100 according to the first and second exemplary embodiments, the amount of light on the irradiation surface 3 becomes uniform. Therefore, the light emitting element arrays 100 according to the first and second exemplary embodiments may be used in the above-described optical measuring system 1, and may also be used in other applications where uniform planar light sources are required, for example, a homonizer for causing a photoreaction in a photoreactive material and so on.

In the embodiments above, the term "processing unit" refers to hardware in a broad sense. Examples of the processor includes general processors (e.g., CPU: Central Processing Unit), dedicated processors (e.g., GPU: Graphics Processing Unit, ASIC: Application Integrated Circuit, FPGA: Field Programmable Gate Array, and programmable logic device). In the embodiments above, the term "processor" is broad enough to encompass one processor or plural processors in collaboration which are located physically apart from each other but may work cooperatively. The order of operations of the processor is not limited to one described in the embodiments above, and may be changed.

In the embodiments above, the term "processing unit" is broad enough to encompass one processor or plural processors in collaboration which are located physically apart from each other but may work cooperatively. The order of operations of the processor is not limited to one described in the embodiments above, and may be changed.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting element array comprising:
a light emitting element group that includes a plurality of light emitting elements; and
a plurality of lenses that is provided, corresponding to the plurality of light emitting elements, on a light emitting surface side of the plurality of light emitting elements, and that deflects light emitted from the plurality of light emitting elements according to a positional relation with the plurality of light emitting elements, wherein
distances between central axes of light emission of the plurality of light emitting elements and central axes of the plurality of lenses corresponding to the plurality of light emitting elements increase from a center side of the light emitting element group toward an end side of the light emitting element group, and
a degree of change in the distances decreases from the center side of the light emitting element group toward the end side of the light emitting element group.

2. The light emitting element array according to claim 1, wherein
the plurality of light emitting elements in the light emitting element group are arranged at predetermined intervals.

3. The light emitting element array according to claim 2, wherein
the plurality of light emitting elements in the light emitting element group are arranged two-dimensionally.

4. The light emitting element array according to claim 3, wherein
the degree of change in the distances between the central axes of light emission of the plurality of light emitting elements and the central axes of the plurality of lenses corresponding to the plurality of light emitting elements varies depending on a first arrangement direction of the plurality of light emitting elements arranged two-dimensionally, and a second arrangement direction crossing the first arrangement direction.

5. The light emitting element array according to claim 1, wherein
the plurality of lenses provided corresponding to the plurality of light emitting elements are arranged at predetermined intervals.

6. The light emitting element array according to claim 5, wherein
the plurality of light emitting elements in the light emitting element group are arranged two-dimensionally.

7. The light emitting element array according to claim 6, wherein
the degree of change in the distances between the central axes of light emission of the plurality of light emitting elements and the central axes of the plurality of lenses corresponding to the plurality of light emitting elements varies depending on a first arrangement direction of the plurality of light emitting elements arranged two-dimensionally, and a second arrangement direction crossing the first arrangement direction.

8. The light emitting element array according to claim 1, wherein
the plurality of light emitting elements in the light emitting element group are arranged two-dimensionally.

9. The light emitting element array according to claim 8, wherein
the degree of change in the distances between the central axes of light emission of the plurality of light emitting elements and the central axes of the plurality of lenses corresponding to the plurality of light emitting elements varies depending on a first arrangement direction of the plurality of light emitting elements arranged two-dimensionally, and a second arrangement direction crossing the first arrangement direction.

10. The light emitting element array according to claim 1, wherein
the plurality of lenses are provided on the light emitting surfaces of the plurality of light emitting elements respectively so as to be adjacent to the light emitting surfaces.

11. An optical measuring system comprising:
the light emitting element array according to claim 1;
a light receiving element that receives reflected light from an object irradiated with light emitted from the light emitting element array; and
a processor configured to determine a distance from the light emitting element array to the object or a shape of the object based on information on the reflected light received by the light receiving element.

12. A light emitting element array comprising:
a light emitting element group that includes a plurality of light emitting elements; and
a plurality of lenses that is provided, corresponding to the plurality of light emitting elements, on a light emitting surface side of the plurality of light emitting elements, and that deflects light emitted from the plurality of light emitting elements according to a positional relation with the plurality of light emitting elements, wherein
the plurality of light emitting elements and the plurality of lenses are arranged such that distances between central axes of light emission of the plurality of light emitting elements and central axes of the plurality of lenses corresponding to the plurality of light emitting elements increase from a center side of the light emitting element group toward an end side of the light emitting element group, and
the plurality of light emitting elements and the plurality of lenses are arranged such that a degree of change in the distances changes non-linearly from the center side of the light emitting element group toward the end side of the light emitting element group such that an amount of light at the end side of the light emitting element group increases and an amount of light at the center side of the light emitting element group decreases as compared to a case where the degree of change in the distances changes linearly from the center side toward the end side of the light emitting element group.

13. The light emitting element array according to claim 12, wherein
the plurality of lenses are provided on the light emitting surfaces of the plurality of light emitting elements respectively so as to be adjacent to the light emitting surfaces.

14. A light emitting element array comprising:
a light emitting element group that includes a plurality of light emitting elements; and
a plurality of lenses that is provided, corresponding to the plurality of light emitting elements, on a light emitting surface side of the plurality of light emitting elements, and that deflects light emitted from the plurality of light emitting elements according to a positional relation with the plurality of light emitting elements, wherein
distances between central axes of light emission of the plurality of light emitting elements and central axes of the plurality of lenses corresponding to the plurality of light emitting elements increase from a center side of the light emitting element group toward an end side of the light emitting element group in at least one direction in which the plurality of light emitting elements and the plurality of lenses are arranged, and
a degree of change in the distances decreases from the center side of the light emitting element group toward the end side of the light emitting element group based on a cosine function in the at least one direction.

15. The light emitting element array according to claim 14, wherein
the plurality of light emitting elements in the light emitting element group are arranged two-dimensionally.

16. An optical measuring system comprising:
the light emitting element array according to claim 14;
a light receiving element that receives reflected light from an object irradiated with light emitted from the light emitting element array; and
a processor configured to determine a distance from the light emitting element array to the object or a shape of the object based on information on the reflected light received by the light receiving element.

* * * * *